United States Patent
Balakrishnan et al.

(10) Patent No.: US 10,177,235 B2
(45) Date of Patent: Jan. 8, 2019

(54) NANO-SHEET TRANSISTORS WITH DIFFERENT THRESHOLD VOLTAGES

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/462,447

(22) Filed: Mar. 17, 2017

(65) Prior Publication Data
US 2018/0082902 A1  Mar. 22, 2018

Related U.S. Application Data

(62) Division of application No. 15/268,993, filed on Sep. 19, 2016, now Pat. No. 9,653,289.

(51) Int. Cl.
*H01L 29/76* (2006.01)
*H01L 29/423* (2006.01)
(Continued)

(52) U.S. Cl.
CPC .. *H01L 29/42376* (2013.01); *H01L 21/02603* (2013.01); *H01L 21/823412* (2013.01);
(Continued)

(58) Field of Classification Search
CPC ......... H01L 21/823412; H01L 29/4983; H01L 29/78651; H01L 29/78696; H01L 29/0673;
(Continued)

(56) References Cited

U.S. PATENT DOCUMENTS 7,759,142 B1*  7/2010  Majhi ............... H01L 21/28518
                                                     257/190
8,309,950 B2  11/2012  Iwayama et al.
(Continued)

OTHER PUBLICATIONS

List of IBM Patents or Patent Applications Treated as Related dated Mar. 17, 2017, 2 pages.
(Continued)

*Primary Examiner* — Shouxiang Hu
(74) *Attorney, Agent, or Firm* — Tutunjian & Bitetto, P.C.; Erik Johnson

(57) ABSTRACT

A method of forming two or more nano-sheet devices with varying electrical gate lengths, including, forming at least two cut-stacks including a plurality of sacrificial release layers and at least one alternating nano-sheet channel layer on a substrate, removing a portion of the plurality of sacrificial release layers to form indentations having an indentation depth in the plurality of sacrificial release layers, and removing a portion of the at least one alternating nano-sheet channel layer to form a recess having a recess depth in the at least one alternating nano-sheet channel layers, where the recess depth is greater than the indentation depth.

19 Claims, 19 Drawing Sheets

(51) Int. Cl.
  *H01L 27/088* (2006.01)
  *H01L 29/06* (2006.01)
  *H01L 29/66* (2006.01)
  *H01L 21/02* (2006.01)
  *H01L 21/84* (2006.01)
  *H01L 21/8238* (2006.01)
  *H01L 21/8234* (2006.01)
  *H01L 29/49* (2006.01)
  *H01L 29/786* (2006.01)
  *H01L 29/40* (2006.01)
  *H01L 29/775* (2006.01)

(52) U.S. Cl.
  CPC ........... *H01L 21/823431* (2013.01); *H01L 21/823807* (2013.01); *H01L 21/823821* (2013.01); *H01L 21/84* (2013.01); *H01L 21/845* (2013.01); *H01L 27/088* (2013.01); *H01L 29/0665* (2013.01); *H01L 29/0673* (2013.01); *H01L 29/401* (2013.01); *H01L 29/42392* (2013.01); *H01L 29/4983* (2013.01); *H01L 29/66545* (2013.01); *H01L 29/78651* (2013.01); *H01L 29/78696* (2013.01); *H01L 29/66439* (2013.01); *H01L 29/775* (2013.01)

(58) Field of Classification Search
  CPC ............ H01L 27/088; H01L 29/42392; H01L 29/66545; H01L 29/66439; H01L 29/42376

USPC ................... 257/347, 288, 401, 241
  See application file for complete search history.

(56) References Cited

U.S. PATENT DOCUMENTS

| | | |
  |---|---|---|
  | 9,653,289 B1 | 5/2017 | Balakrishnan et al. |
  | 2006/0240622 A1* | 10/2006 | Lee ............... H01L 29/42392 438/257 |
  | 2014/0225065 A1* | 8/2014 | Rachmady ........ H01L 29/42392 257/24 |
  | 2015/0318282 A1* | 11/2015 | Rodder ........... H01L 21/823418 257/392 |
  | 2015/0333162 A1* | 11/2015 | Bouche ............ H01L 21/76897 257/24 |
  | 2015/0372104 A1* | 12/2015 | Liu .................. H01L 29/42364 257/77 |
  | 2016/0027870 A1* | 1/2016 | Cheng ............. H01L 29/0673 257/347 |
  | 2016/0099338 A1 | 4/2016 | Chang et al. |
  | 2018/0047832 A1 | 2/2018 | Tapily et al. |

OTHER PUBLICATIONS

U.S. Appl. No. 15/268,993, filed Sep. 19, 2016.
  Office Action in corresponding U.S. Appl. No. 15/462,372 dated Apr. 6, 2018, pp. 1-18.

* cited by examiner

NANO-SHEET TRANSISTORS WITH DIFFERENT THRESHOLD VOLTAGES

BACKGROUND

Technical Field

The present invention generally relates to the fabrication of two or more nano-sheet transistors on the same substrate having different threshold voltages, and more particularly to forming different sized recesses to provide nano-sheet channels having different gate lengths.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method of forming two or more nano-sheet devices with varying electrical gate lengths is provided. The method includes forming at least two cut-stacks including a plurality of sacrificial release layers and at least one alternating nano-sheet channel layer on a substrate. The method further includes removing a portion of the plurality of sacrificial release layers to form indentations having an indentation depth in the plurality of sacrificial release layers. The method further includes removing a portion of the at least one alternating nano-sheet channel layer to form a recess having a recess depth in the at least one alternating nano-sheet channel layers, where the recess depth is greater than the indentation depth.

In accordance with another embodiment of the present invention, a method of forming two or more nano-sheet devices with varying electrical gate lengths is provided. The method includes forming a channel stack including a plurality of sacrificial release layers and at least one alternating nano-sheet channel layer on a substrate. The method further includes forming two or more dummy gates including a dummy gate fill and a side spacer on the channel stack. The method further includes removing exposed portions of the channel stack not covered by the two or more dummy gates to form two or more cut-stacks. The method further includes removing a portion of the plurality of sacrificial release layers to form indentations having an indentation depth in the plurality of sacrificial release layers. The method further includes forming an indentation fill layer in the indentations. The method further includes forming a mask on at least one of the two or more cut-stacks. The method further includes removing a portion of the at least one alternating nano-sheet channel layer to form a recess in the unmasked cut-stacks.

In accordance with yet another embodiment of the present invention, a pair of adjacent nano-sheet devices on the same substrate is provided. The pair of adjacent nano-sheet devices includes a first nano-sheet device including, two source/drain regions on a substrate, where the two source/drain regions are separated by a distance, at least one nano-sheet channel layer having a length spanning the distance between the two source/drain regions, and a gate structure on the at least one nano-sheet channel layer having a physical gate length. The pair of adjacent nano-sheet devices includes a second nano-sheet device including, two source/drain regions on a substrate, where the two source/drain regions are separated by a distance, at least one nano-sheet channel layer having a length spanning the distance between the two source/drain regions, and a gate structure on the at least one nano-sheet channel layer having a physical gate length. The physical gate length of the first nano-sheet device is the same as the physical gate length of the second nano-sheet device, and the length of the at least one nano-sheet channel layer of the first nano-sheet device is different than the length of the at least one nano-sheet channel layer of the second nano-sheet device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
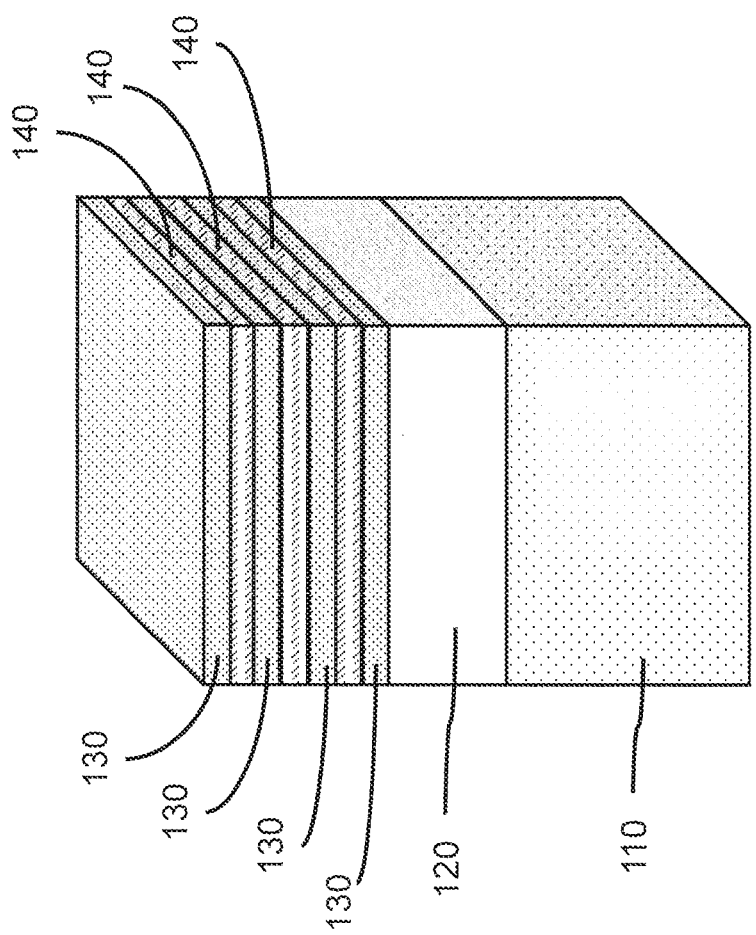
FIG. 1 is a cross-sectional isometric view showing a plurality of nano-sheet layers separated by sacrificial release layers on an insulating layer of a substrate, in accordance with an embodiment of the present invention.

Principles and embodiments of the present invention relate to fabricating a plurality of transistor devices utilizing nano-sheets for the channel of the devices, where the nano-sheets have different lengths. The electrical gate length, $L_{Ge}$, of the different devices can be varied by using a sequence of etching steps to modify the nano-sheet lengths. The different gate lengths can provide different threshold voltages, $V_T$.

Principles and embodiments of the present invention also relate to forming nano-sheet transistor devices having different threshold voltages adjacent to each other on the same substrate by controlling the number of etching steps each transistor device undergoes during fabrication. Multiple timed etches can be used to remove predetermined amounts of each exposed nano-sheet channel layer to produce a cut-stack with a predetermined electrical gate length and threshold voltage, while neighboring nano-sheet transistor devices are masked during the etching steps.

Principles and embodiments of the present invention also relate to forming a plurality of nano-sheet devices having nano-sheets initially with the same dimensions, and selectively removing predetermined portions of the nano-sheets to produce nano-sheet devices having different nano-sheet channel layers with different final dimensions.

Principles and embodiments of the present invention relate to controlling threshold voltages of nano-sheet devices without using channel doping.

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), etc.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional isometric view of a plurality of nano-sheet layers separated by sacrificial release layers on an insulating layer of a substrate is shown, in accordance with an embodiment of the present invention.

In one or more embodiments, a substrate 110 can be a semiconductor or an insulator with an active surface semiconductor layer (ASL). The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, Al$_2$O$_3$, SiO$_2$, GaAs, SiC, or SiGe.

In one or more embodiments, the substrate can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface semiconductor layer of the substrate 110 can be on a substrate insulator layer 120 (e.g., buried oxide layer (BOX)). The substrate 110 can also have other layers forming the substrate, including high-k oxides and/or nitrides.

In one or more embodiments, a substrate insulator layer 120 (e.g., BOX layer) can be formed on at least a portion of a substrate 110. An active surface semiconductor layer can be on the BOX layer. The active surface semiconductor layer can be on the buried oxide (BOX) layer, which physically separates and electrically insulates the active surface layer from a mechanically supporting portion of the substrate 110.

In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) active surface layer. In one or more embodiments, the substrate 110 can be a silicon wafer.

In one or more embodiments, a plurality of sacrificial release layers 130 can be formed with one or more alternating nano-sheet channel layers 140 on a substrate 110, where the substrate 110 can be a semiconductor-on-insulator (SeOI) substrate with either a sacrificial release layer 130 or a nano-sheet channel layer 140 forming the active surface semiconductor layer directly on the substrate insulator layer 120. The plurality of sacrificial release layers 130 and at least one alternating nano-sheet channel layer(s) 140 can form a stack on the substrate 110. In various embodiments, there can be N sacrificial release layers 130 and N−1 nano-sheet channel layers 140, where a sacrificial release layer can be between the substrate 110 and a nano-sheet channel layer 140, and a sacrificial release layer can be the upper-most layer in the stack. For example, there can be two sacrificial release layers 130 and one nano-sheet channel layer 140 between and separating the two sacrificial release layers 130.

In various embodiments, the top-most sacrificial release layer 130 may be optional, such that there are N sacrificial release layers 130 and N nano-sheet channel layers 140, where a sacrificial release layer 130 can be between the substrate insulator layer 120 and a nano-sheet channel layer 140. Removal of a dummy gate fill could thereby expose the top-most nano-sheet channel layer 140.

In a non-limiting exemplary embodiment, the substrate 110 can be a silicon-germanium-on-insulator substrate having a silicon-germanium active surface layer as the bottom-most sacrificial release layer 130 on the substrate insulator layer 120. In various embodiments, a single crystal, active surface layer (e.g., silicon, silicon-germanium, etc.) may be formed on the substrate insulator layer 120 by a layer transfer method, as would be known in the art.

In various embodiments, the sacrificial release layers 130 can have a top surface, a bottom surface, and a thickness there between, where the sacrificial release layers 130 can be formed on the surface of the substrate 110 or substrate insulator layer 120. In various embodiments, the sacrificial release layer 130 or nano-sheet channel layer 140 can be epitaxially grown on a crystalline surface of the substrate 110. The sacrificial release layers 130 can be heteroepitaxially deposited on an exposed crystalline surface, for example, on a crystalline nano-sheet channel layer 140. The sacrificial release layers 130 can be a different material than the substrate material, substrate insulator layer 120, and/or the material of the nano-sheet channel layer 140, such that the sacrificial release layers 130 can be selectively removed, for example, by an etching process.

In one or more embodiments, the sacrificial release layers 130 can have a thickness in the range of about 5 nm to about 20 nm, or in the range of about 10 nm to about 15 nm, or about 10 nm, although other thicknesses are also contemplated.

In one or more embodiments, a sacrificial release layer 130 can be made of a material that can be selectively etched compared to the material of the nanosheet channel layer 140 and/or substrate 110 material, such that the sacrificial release layers 130 can be selectively removed from between nano-sheet channel layers 140. In a non-limiting exemplary embodiment, the sacrificial release layer 130 can be silicon-germanium (Si$_x$Ge$_{1-x}$), where the germanium concentration can be about 20 at. % to about 70 at. %, or about 30 at. % to about 50 at. %, or about 30 at. % (atomic percent).

In one or more embodiments, the nano-sheet channel layer 140 can be epitaxially formed on an underlying crystalline sacrificial release layer 130. In a non-limiting exemplary embodiment, the sacrificial release layers 130 can be crystalline SiGe layers having predetermined crystal orientation for growing nano-sheet channel layers 140. In a non-limiting exemplary embodiment, the nano-sheet channel layer(s) 140 can be a single crystal silicon layer on the crystalline sacrificial release layer 130. In another non-limiting exemplary embodiment, the sacrificial release layers 130 can be crystalline silicon layers and the nano-sheet channel layer(s) 140 can be a single crystal silicon-germanium layer(s), where the sacrificial release layers 130 can be selectively etched relative to the nano-sheet channel layer(s) 140.

Figure 2:
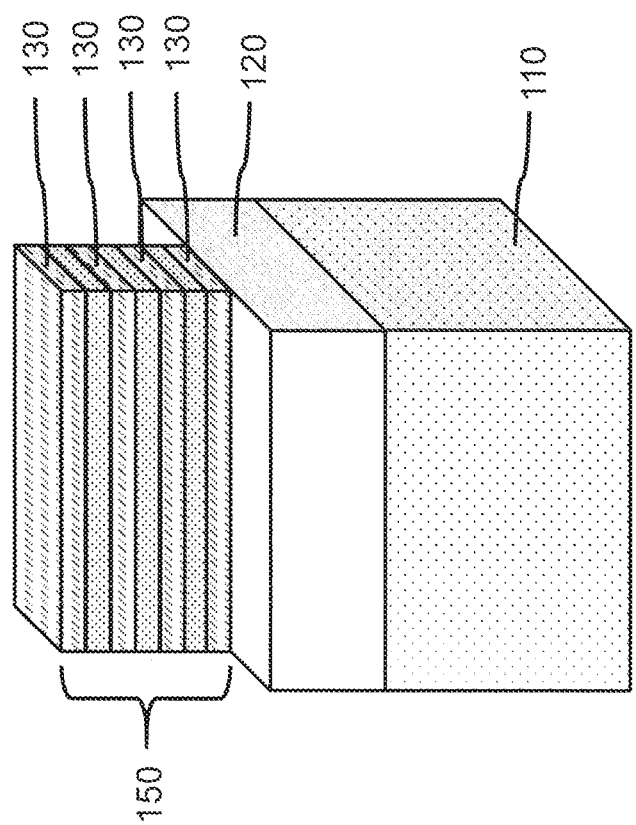
FIG. 2 is a cross-sectional isometric view showing a plurality of patterned nano-sheet channel layers and sacrificial release layers on an insulating layer of a substrate, in accordance with an embodiment of the present invention.

FIG. 2 is a cross-sectional isometric view showing a plurality of patterned nano-sheet channel layers and sacrificial release layers on an insulating layer of a substrate, in accordance with an embodiment of the present invention.

In one or more embodiments, the stack of alternating sacrificial release layers 130 and nano-sheet channel layers 140 can be masked and patterned, as would be known in the art to form a channel stack 150 having a long lateral dimension (i.e., length), a short lateral dimension (i.e., width), and a height. A portion of the stack of sacrificial release layers 130 and nano-sheet channel layers 140 can be removed, for example, by a directional etch (e.g., reactive ion etch (RIE)) to form a channel stack 150. The directional etch may be a non-selective, timed RIE to remove unmasked portions of the sacrificial release layers 130 and nano-sheet channel layers 140 through a single etching step, or alternating selective RIEs may be used to remove exposed portion(s) of each layer separately.

Figure 3:
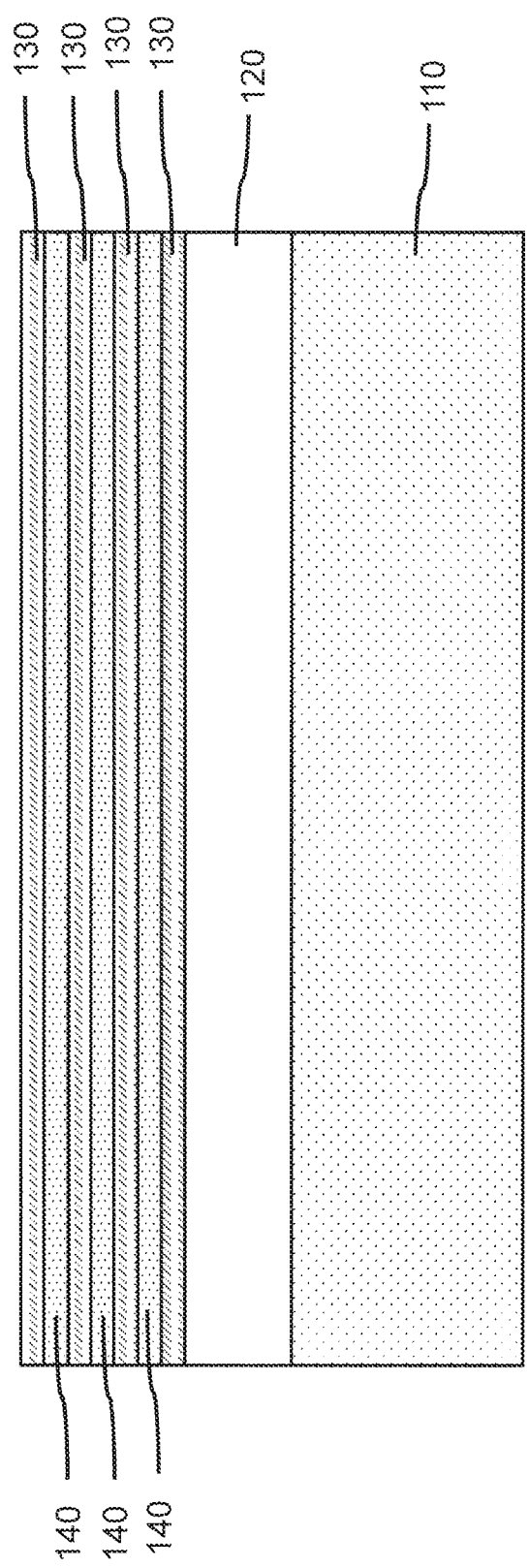
FIG. 3 is a cross-sectional side view showing a patterned channel stack including nano-sheet channel layers and sacrificial release layers on an insulating layer of a substrate, in accordance with an embodiment of the present invention.

FIG. 3 is a cross-sectional side view showing a patterned channel stack including nano-sheet channel layers and sacrificial release layers on an insulating layer of a substrate, in accordance with an embodiment of the present invention.

In one or more embodiments, the patterned channel stack 150 may be sufficiently long to form a plurality of dummy gates on the channel stack, where portions of the channel stack between dummy gates may be removed to form separate nano-sheet devices. Two or more dummy gates can be formed on the same channel stack 150.

Figure 4:
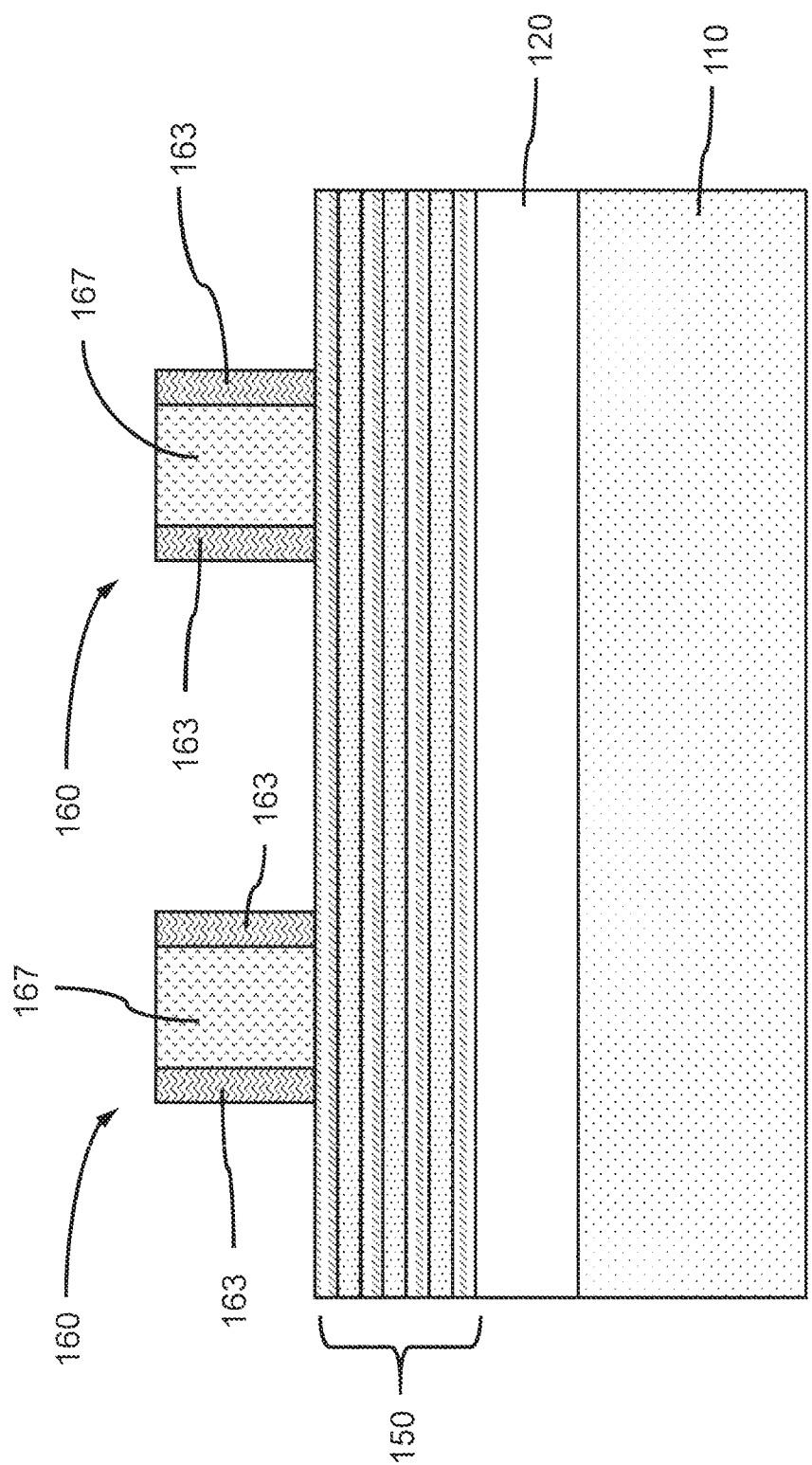
FIG. 4 is a cross-sectional side view showing two dummy gates with side spacers on a patterned channel stack of nano-sheet channel layers and sacrificial release layers, in accordance with an embodiment of the present invention.

FIG. 4 is a cross-sectional side view showing two dummy gates with side spacers on a patterned channel stack of nano-sheet channel layers and sacrificial release layers, in accordance with an embodiment of the present invention.

In one or more embodiments, one or more dummy gates 160 can be formed on the channel stack 150. A dummy gate can include side spacers 163 and a dummy gate fill 167. The dummy gate(s) 160 can be formed by processes known in the art, including masking, patterning, etching, deposition, and planarization processes/steps. In various embodiments, the dummy gate(s) 160 can be formed by a double patterning process (e.g., sidewall image transfer (SIT)). The side spacer 163 can be completely around the dummy gate fill 167.

In one or more embodiments, a dummy gate 160 can be formed on a channel stack 150, where the dummy gate 160 can be formed over three sides of the channel stack. In various embodiments, the dummy gate 160 can be a material that can be easily and selectively removed from the layers of the channel stack 150, including, but not limited to, polysilicon (p-Si), amorphous silicon (a-Si), amorphous carbon (a-C), silicon oxide (SiO), silicon nitride (SiN), silicon oxynitride (SiON), and combinations thereof. In various embodiments, the dummy gate 160 may include multiple material layers (e.g., a capping layer), where the dummy gate can be a dummy gate stack.

In one or more embodiments, a side spacer 163 can be formed on each of the dummy gate fills 167. The side spacer 163 can be conformally deposited on the dummy gate fill 167 and exposed surfaces of the channel stack 150, and etched back using a directional etch (e.g. RIE) to expose the top surface of the dummy gate fill 167, the channel stack 150, and the substrate surface, while remaining on the vertical surfaces of the dummy gate fills 167.

In various embodiments, the side spacer 163 can be a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the dummy gate fill 167 can be selectively etched relative to the side spacer 163.

Figure 5:
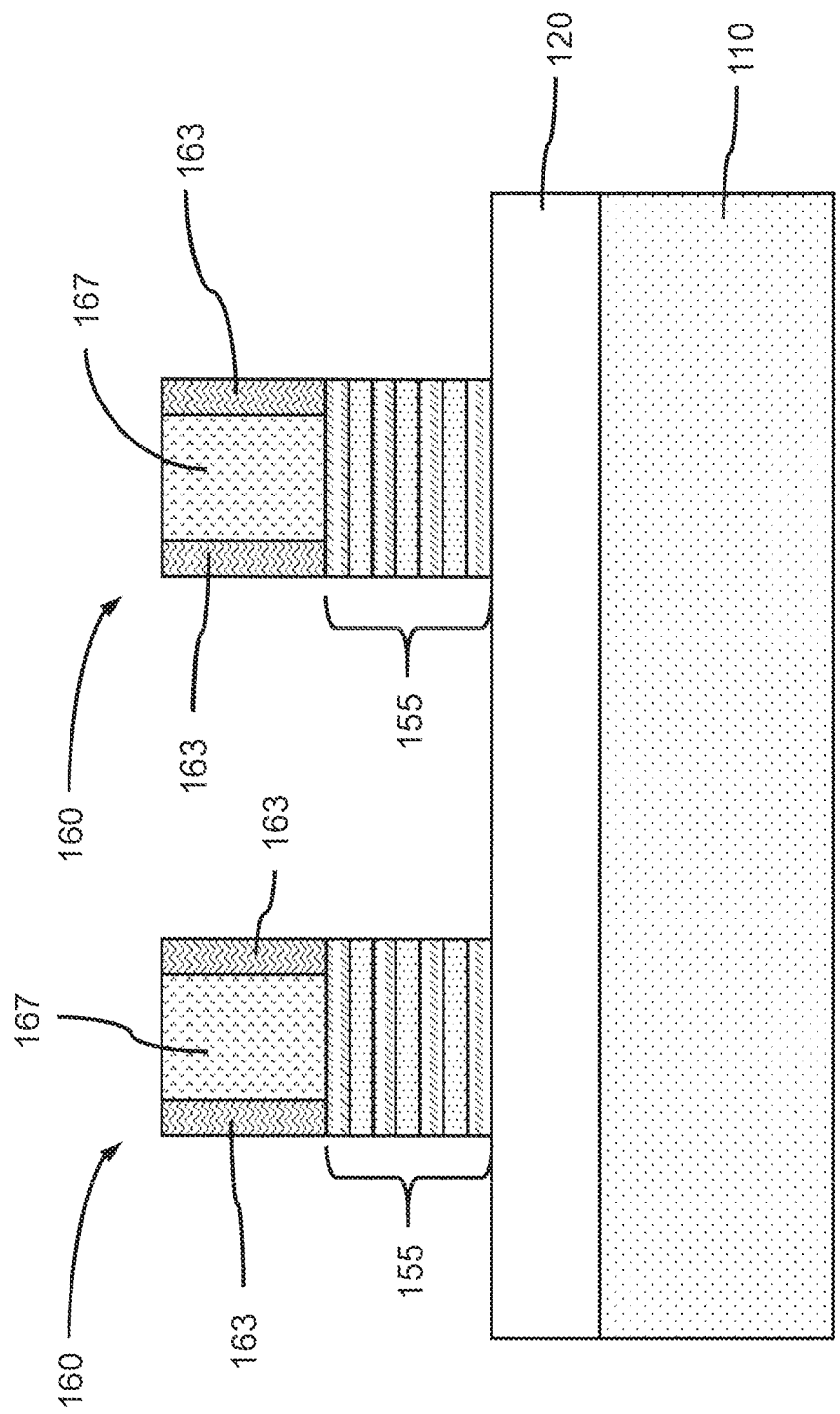
FIG. 5 is a cross-sectional side view showing a dummy gate on each of two cut-stacks of nano-sheet channel layers and sacrificial release layers, in accordance with an embodiment of the present invention.

FIG. 5 is a cross-sectional side view showing a dummy gate on each of two cut-stacks of nano-sheet channel layers and sacrificial release layers, in accordance with an embodiment of the present invention.

In one or more embodiments, the portions of the channel stack 150 exposed between the dummy gates 160 can be removed to form cut-stacks 155, where the dummy gates can mask the cut-stacks, and the cut-stacks can have the same resulting lateral dimension as the dummy gate 160. The exposed portions of the channel stacks can be removed using a directional etch (e.g., RIE) to form essentially vertical sides to the cut-stack 155. The cut-stack 155 includes the alternating sacrificial release layers 130 and nano-sheet channel layer(s) 140, where the ends of the sacrificial release layers 130 and nano-sheet channel layer(s) 140 are exposed.

Figure 6:
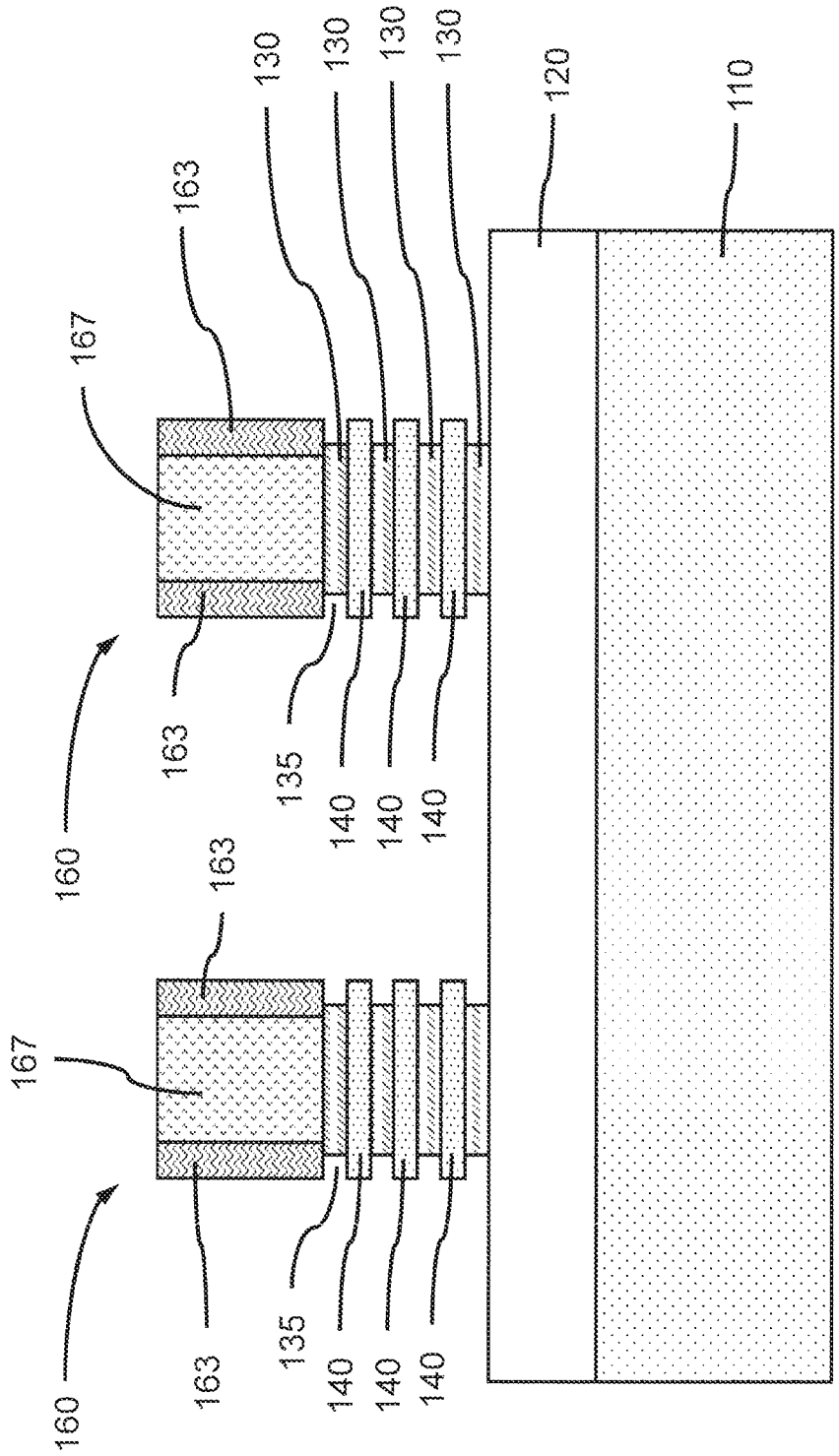
FIG. 6 is a cross-sectional side view showing indentations formed by removal of a portion of each sacrificial release layer in a cut-stack, in accordance with an embodiment of the present invention.

FIG. 6 is a cross-sectional side view showing indentations formed by removal of a portion of each sacrificial release layer in a cut-stack, in accordance with an embodiment of the present invention.

In one or more embodiments, a portion of the sacrificial release layers 130 can be removed to reduce the size of the sacrificial release layers in at least one lateral dimension (i.e., length, width). The portion of the sacrificial release layers 130 can be removed using an isotropic etch (e.g., wet chemical etch, non-directional dry plasma etch, etc.), where the isotropic etch etches laterally into the sacrificial release layers 130. The isotropic etch can remove a predetermined amount of material from the sacrificial release layers 130, where the etch can be a timed etch to uniformly remove an equal amount of material from each exposed end. The isotropic etch can form indentations 135 having a predetermined indentation depth into the sacrificial release layers 130. After a first etching process, the nano-sheet channel layers 140 can extend passed the sacrificial release layers 130 by a predetermined distance. Each of the indentations 135 can extend into the area below the side spacer 163 and dummy gate 167.

In one or more embodiments, the indentations 135 can have an indentation depth in the range of about 2 nm to about 10 nm, or in the range of about 2 nm to about 5 nm, or in the range of about 5 nm to about 10 nm, although other depths are also contemplated. The depth of the indentation can determine the remaining length of the sacrificial release layers 130 below the dummy gate(s) 160, and thereby the width of a subsequently formed gate fill layer and/or gate electrode at the bottom of the gate structure. The depth of the indentation can also determine, at least in part, the amount of capacitive overlap, $C_{ov}$, between the gate structure and the nano-sheet channel layer(s) 140.

Figure 7:
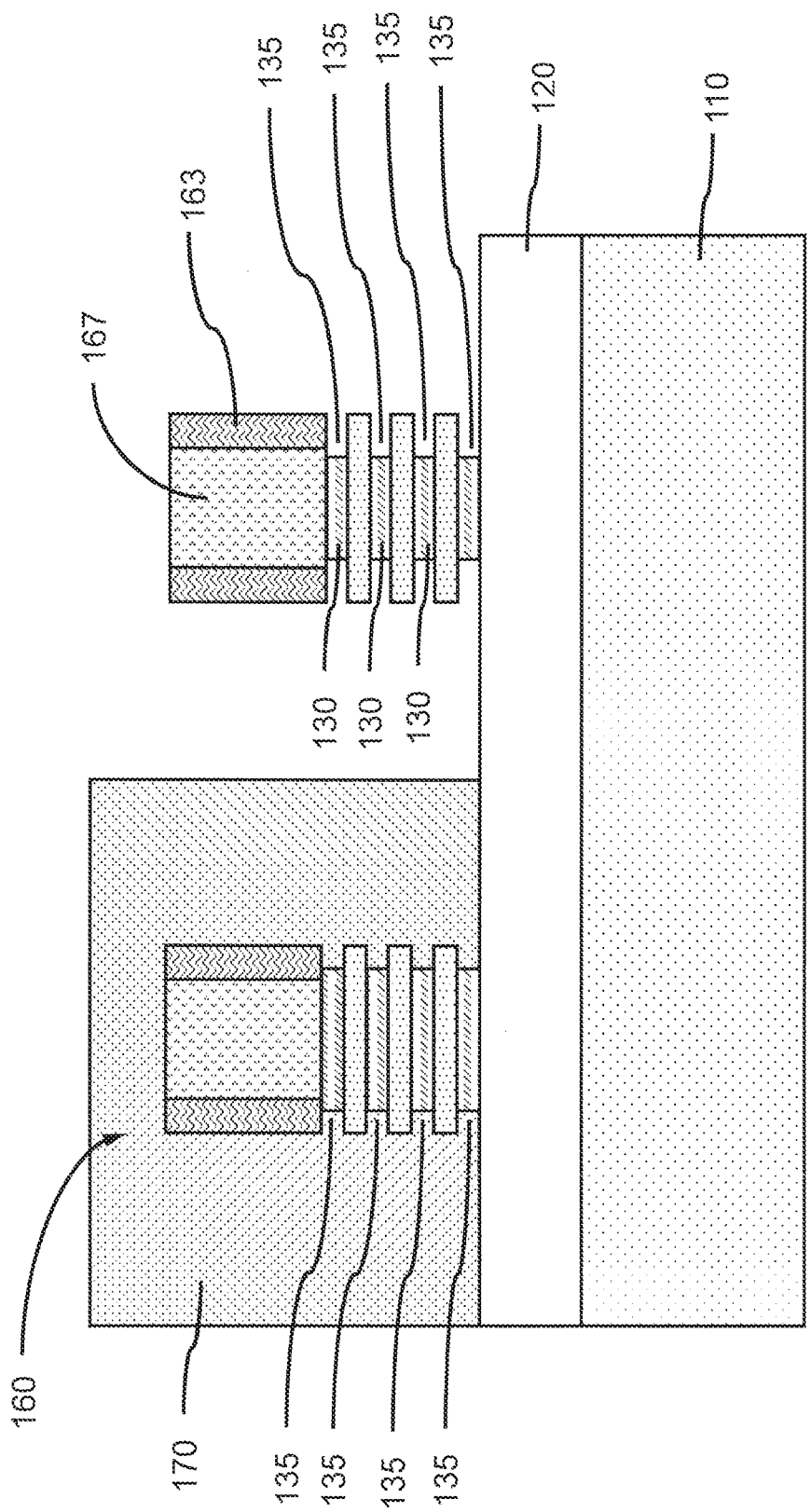
FIG. 7 is a cross-sectional side view showing enlarged indentations formed by removal of an additional portion of each sacrificial release layer of an unmasked cut-stack, in accordance with an embodiment of the present invention.

FIG. 7 is a cross-sectional side view showing enlarged indentations formed by removal of an additional portion of each sacrificial release layer of an unmasked cut-stack, in accordance with an embodiment of the present invention.

In one or more embodiments, a mask 170 can be formed on the one or more dummy gates 160 and cut-stacks 155, for example, with an organic resist material or spin-on layer, leaving one or more dummy gates 160 and cut-stacks 155 exposed for etching, as would be known in the art.

In one or more embodiments, additional portions of the one or more exposed sacrificial release layers 130 can be removed using a second timed isotropic etch, for example, a wet etch or isotropic dry plasma etch, where the etchant can enter into the indentations 135 formed by the first etch. In various embodiments, the indentations 135 can extend below the dummy gate fill 167 and side spacer 163, where the isotropic etch selectively removes sacrificial release layer material not otherwise exposed. Additional etching steps may be used to remove additional material from one or more cut-stacks 155. The indentation depth of the previously formed indentations 135 can thereby be increased.

The sacrificial release layers 130 of the masked cut-stack 155 can remain unaffected by the second and any subsequent etching steps, so the initially formed indentations 135 can remain the same depth. In various embodiments, the mask 170 can be removed from one or more of the masked cut-stacks 155 subsequent to the second etch, and a third timed etch may be used to remove additional material from both the previously masked cut-stack and the exposed cut-stack to achieve three different predetermined etch depths for the indentations 135. The process can be repeated to prepare multiple cut-stacks 155 with different indentation depths on the substrate 110. The indentation depth of the previously formed indentations 135 can thereby be increased, while indentations of a different depth can thereby be created in the sacrificial release layers 130 of a different cut-stack 155.

Figure 8:
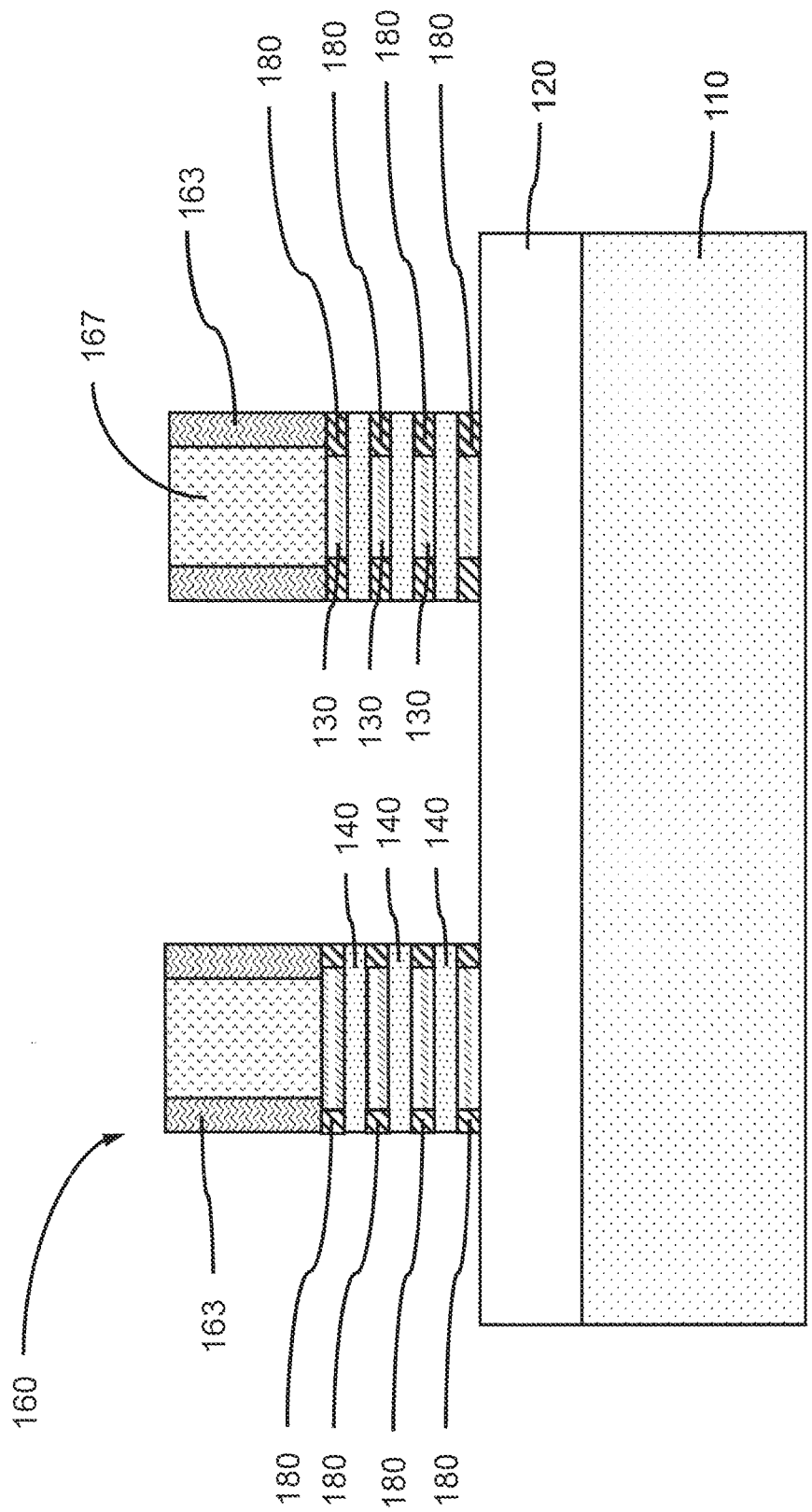
FIG. 8 is a cross-sectional side view showing indentation fill layers formed in the different sized indentations of each cut-stack, in accordance with an embodiment of the present invention.

FIG. 8 is a cross-sectional side view showing indentation fill layers formed in the different sized indentations of each cut-stack, in accordance with an embodiment of the present invention.

In one or more embodiments, an indentation fill layer 180 can be formed on the one or more nano-sheet channel layer(s) 140 and one or more sacrificial release layers 130, where the indentation fill layer 180 can fill the indentations 135 adjacent to the remaining portion of the sacrificial release layers 130, and between overhanging nano-sheet channel layer(s) 140. The indentation fill layer 180 can be formed on at least a portion of the substrate 110 and dummy gate 160, and may be etched back by the RIE to leave the indentation fill layers 180 in the indentations 135.

In one or more embodiments, the indentation fill layer 180 can be formed by ALD, PEALD, CVD, PECVD, or combinations thereof, where the indentation fill layer 180 can be conformally deposited within the indentations 135 (e.g., by ALD) to fill the indentations. Portions of the indentation fill layer 180 that extend out beyond the side spacers 163 of the dummy gate can be removed by a directional etch (e.g., RIE).

In one or more embodiments, the indentation fill layer 180 can be a silicon nitride (SiN), a silicon oxide (SiO), silicon oxynitride (SiON), silicon oxycarbide (SiOC), a silicon boro carbonitride (SiBCN), a silicon oxy carbonitride (SiOCN), a silicon carbide (SiC), a high-k metal oxide, a low-k insulator, or suitable combinations thereof.

In various embodiments, the low-k insulator can include, but is not limited to, a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof. A low-k insulator material can have a dielectric constant of less than 3.9.

In various embodiments, the high-K metal oxide can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

Figure 9:
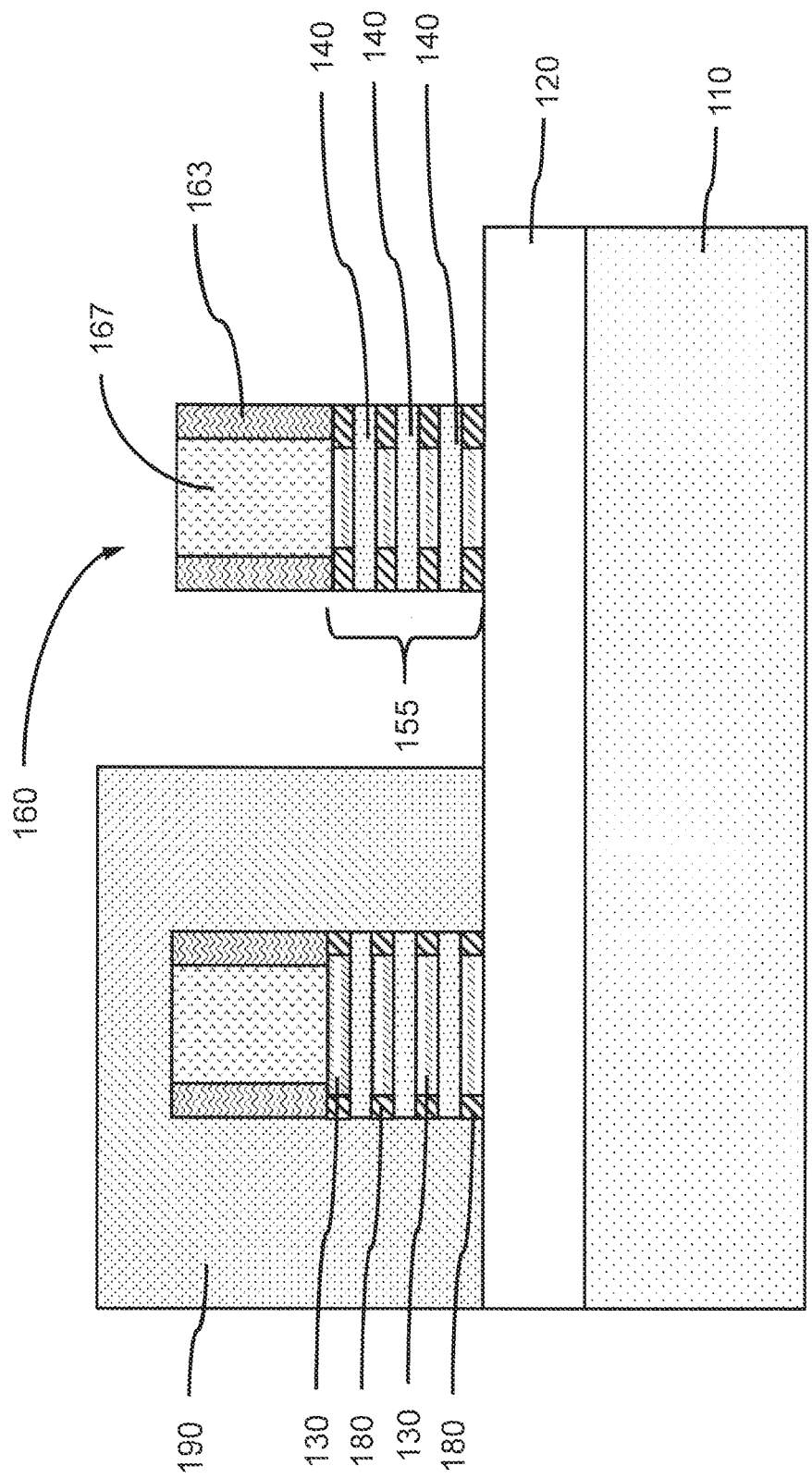
FIG. 9 is a cross-sectional side view showing a masked cut stack and an unmasked cut-stack, in accordance with an embodiment of the present invention.

FIG. 9 is a cross-sectional side view showing a masked cut stack and an unmasked cut-stack, in accordance with an embodiment of the present invention.

In one or more embodiments, one or more dummy gates 160 and cut-stacks 155 on the substrate 110 can be covered by a second masking layer 190, where the second masking layer 190 can be an organic resist or organic planarization material (e.g., poly methyl methacrylate (PMMA)). One or more cut-stacks can remain exposed.

Figure 10:
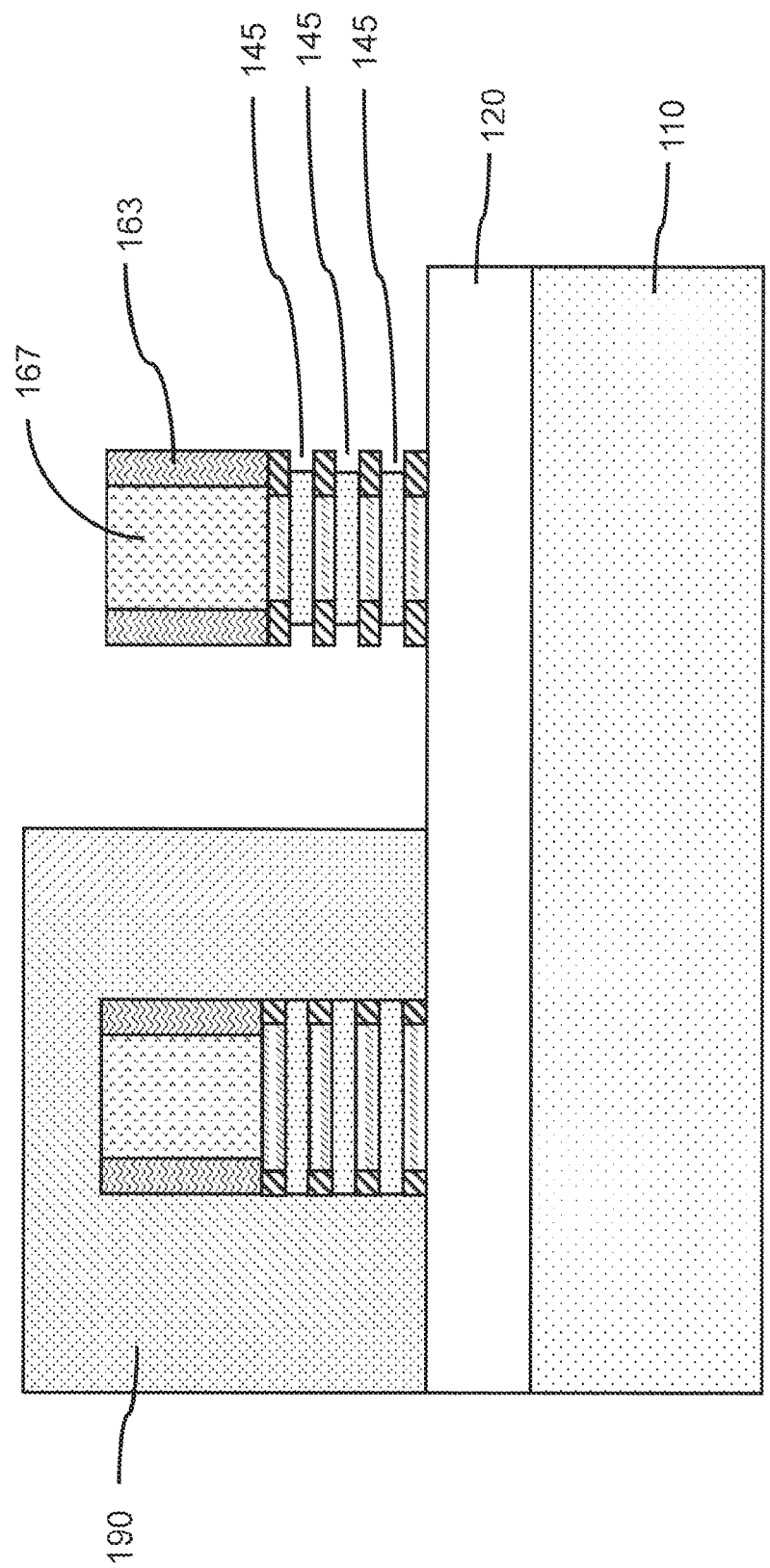
FIG. 10 is a cross-sectional side view showing recesses formed by removal of a portion of each nano-sheet channel layer of an unmasked cut-stack, in accordance with an embodiment of the present invention.

FIG. 10 is a cross-sectional side view showing recesses formed by removal of a portion of each nano-sheet channel layer of an unmasked cut-stack, in accordance with an embodiment of the present invention.

In one or more embodiments, a portion of the nano-sheet channel layers 140 can be removed to reduce the size of the nano-sheet channel layers in at least one lateral dimension (i.e., length, width). The portion of the nano-sheet channel layers 140 can be removed using a selective isotropic etch (e.g., wet chemical etch, non-directional dry plasma etch, etc.), where the isotropic etch etches laterally into the nano-sheet channel layers 140 of the unmasked cut-stack 155. The isotropic etch can remove a predetermined amount of material from the nano-sheet channel layers 140, where the etch can be a timed etch to uniformly remove an equal amount of material from the exposed ends of the nano-sheet channel layers 140. The isotropic etch can form recesses 145 having a predetermined recess depth into the nano-sheet channel layers 140. After a first etching process, the indentation fill layers 180 can extend passed the ends of the nano-sheet channel layers 140 by a predetermined distance. Each of the recesses 145 can extend into the area below the side spacer 163 and dummy gate 167. In various embodiments, the mask 190 can be removed from one or more of the masked cut-stacks 155 subsequent to the first etch.

Figure 11:
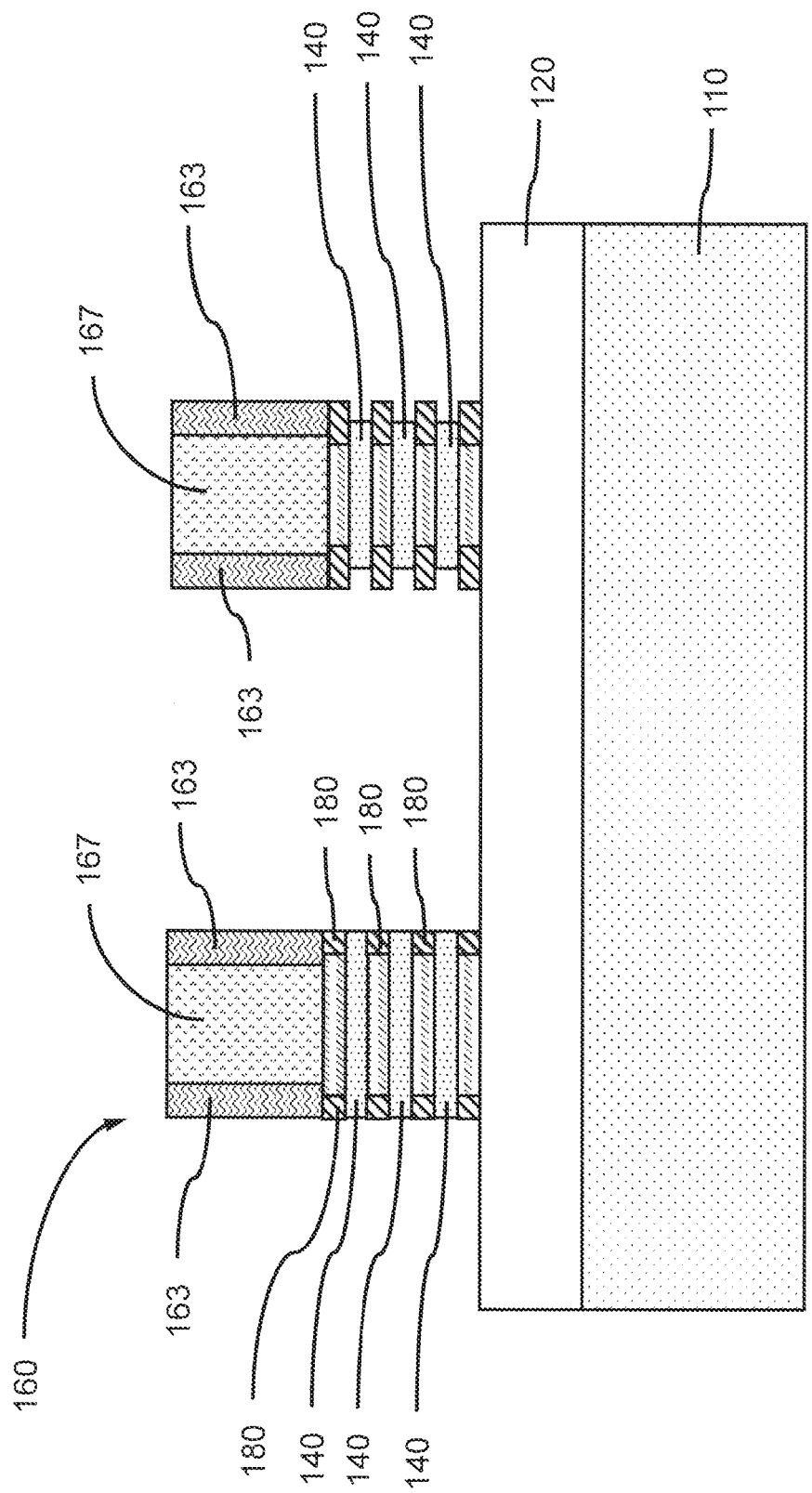
FIG. 11 is a cross-sectional side view of an unmasked cut-stack with recessed nano-sheet channel layers and an unmasked cut-stack without recessed nano-sheet channel layers, in accordance with an embodiment of the present invention.

FIG. 11 is a cross-sectional side view of an unmasked cut-stack with recessed nano-sheet channel layers and an unmasked cut-stack without recessed nano-sheet channel layers, in accordance with an embodiment of the present invention.

In one or more embodiments, the second masking layer 190 can be removed from one or more cut-stacks 155 after the portions of the nano-sheet channel layers 140 have been removed using a selective isotropic etch. The second masking layer 190 can be removed using processes known in the art (e.g., ashing, stripping, etc.). Removal of the second masking layer 190 can expose the previously masked cut-stack 155 for removal of a portion of the nano-sheet channel layers 140. The indentation fill layers 180 can protect the ends of the sacrificial release layers 130 during subsequent etching of the nano-sheet channel layers 140.

In one or more embodiments, additional portions of the one or more exposed nano-sheet channel layer(s) 140 can be removed from previously etched nano-sheet channel layer(s) using a second timed isotropic etch, for example, a wet etch or dry plasma etch, where the etchant can enter into the recesses 145 formed by the first etch. Additional etching steps may be used to remove additional material from one or more exposed cut-stacks 155. In various embodiments, the isotropic etch selectively removes nano-sheet channel layer material not otherwise covered by the dummy gate 160.

In one or more embodiments, portions of the one or more exposed nano-sheet channel layer(s) 140 can be removed from previously unetched cut-stacks 155, where the nano-sheet channel layer(s) are exposed by removal of the second mask 190, while nano-sheet channel layer(s) 140 of still masked cut-stack 155 can remain unaffected by the second and any subsequent etching steps.

The duration of the timed etch may be selected to remove a predetermined amount of nano-sheet channel layer material from each exposed recess 145, so the depth of the recess increases by the predetermined amount for all exposed nano-sheet channel layers 140. For example, an etch process that removes 1 nm of nano-sheet channel layer material per minute can be conducted for 2 minutes to increase the depth of the recesses 145 by 2 nm. The cut-stacks 155 that had previously undergone a 2 minute etch would therefore have recesses 145 that are 4 nm in depth, whereas the cut-stack that only underwent the second etch would have recesses with a 2 nm depth.

In various embodiments, the mask 190 can be removed from one or more of the still masked cut-stacks 155 subsequent to the second etch, and a third timed etch may be used to remove additional material from both the previously masked cut-stack and the exposed cut-stack to achieve three different predetermined etch depths for the recesses 145. The process can be repeated to prepare multiple cut-stacks 155 with different recess depths on the substrate 110. The recess depth can be greater than the indentation depth for at least one cut-stack 155.

In various embodiments, the mask(s) 190 can be removed from different cut-stacks 155 after a predetermined number of etching steps to expose previously unetched nano-sheet channel layer(s) 140, and masks 190 can be formed on previously etched nano-sheet channel layer(s) 140 to prevent further etching to thereby control the final recess depth of each of a plurality of cut-stacks 155 on a substrate 110. Additional etching steps may be used to remove additional material from the nano-sheet channel layers 140 of one or more exposed cut-stacks 155.

Figure 12:
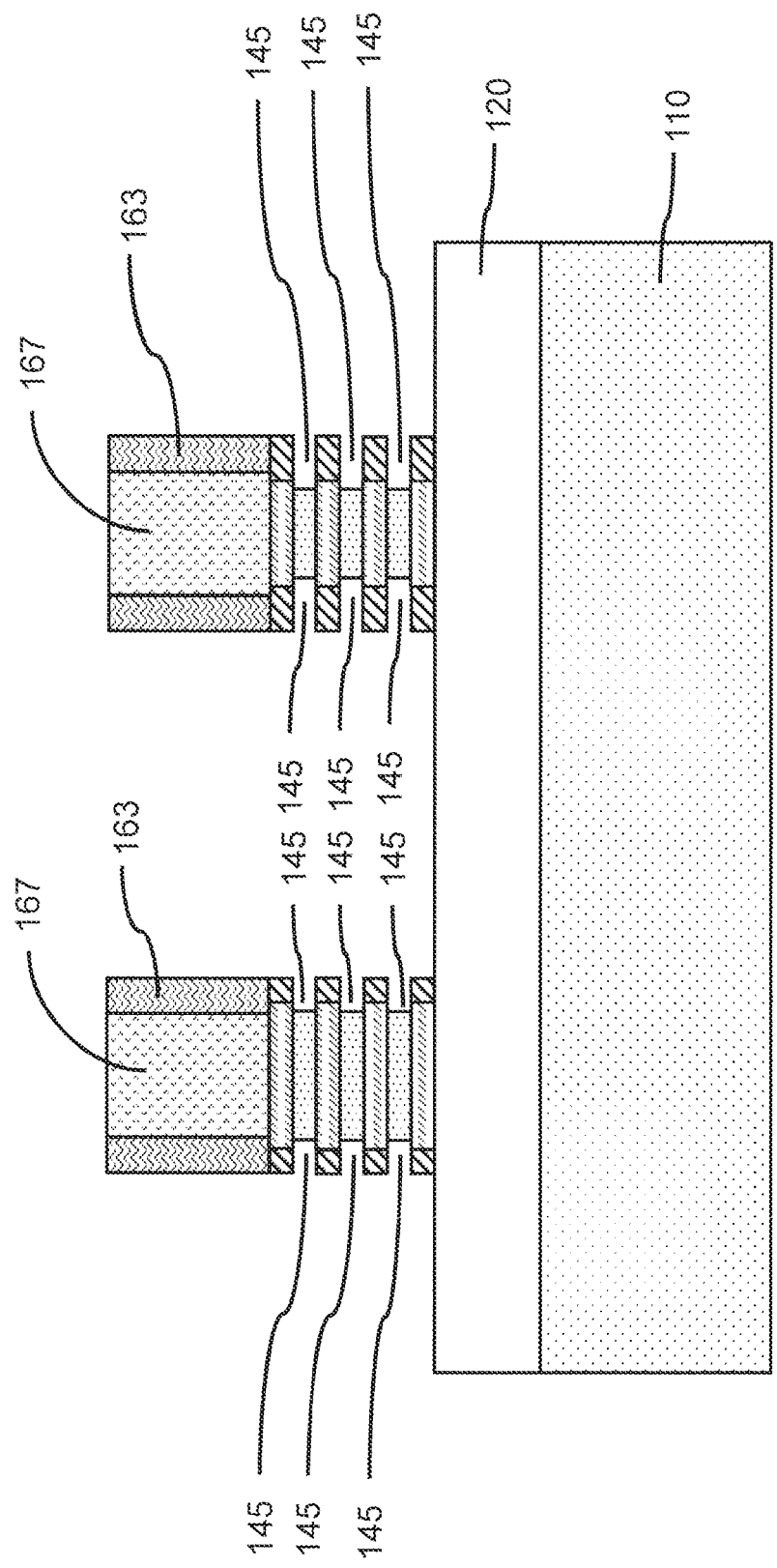
FIG. 12 is a cross-sectional side view of two cut-stacks having different sized recesses formed in the nano-sheet channel layers, in accordance with an embodiment of the present invention.

FIG. 12 is a cross-sectional side view of two cut-stacks having different sized recesses formed in the nano-sheet channel layers, in accordance with an embodiment of the present invention.

In one or more embodiments, the nano-sheet channel layers 140 can have a length in the range of about 15 nm to about 25 nm, or in the range of about 15 nm to about 20 nm, or in the range of about 19 nm to about 25 nm, although other lengths are also contemplated. In various embodiments, the nano-sheet channel layers of two different devices can have a difference in length in the range of about 2 nm to about 10 nm, or in the range of about 4 nm to about 10 nm, or in the range of about 2 nm to about 5 nm. In a non-limiting exemplary embodiment, the nano-sheet channel layers 140 of a first nano-sheet device can have a length in the range of about 15 nm to about 19 nm, and the nano-sheet channel layers 140 of a second nano-sheet device can have a length in the range of about 20 nm to about 25 nm, where the shorter nano-sheet channel layers can provide faster devices and the longer nano-sheet channel layers can provide devices with lower leakage current. In various embodiments, the recesses 145 can extend below the dummy gate fill 167 and side spacer 163, where the isotropic etch selectively removed nano-sheet channel layer material.

Different $V_T$s can be achieved by laterally undercutting the nano-sheet channel layers 140 in different cut-stacks 155 by different amounts. The source and drain of each nano-sheet device can then be formed on the endwalls of the recessed nano-sheet channel layers 140 by in-situ doped epitaxy. As a result, the nano-sheet devices can have about the same physically gate length, $L_G$, but different electrical gate length, $L_{Ge}$, due to different extents of lateral undercutting that reduces at least one lateral dimension (e.g., length) of the nano-sheet channel layers 140 to form the recesses 145.

Figure 13:
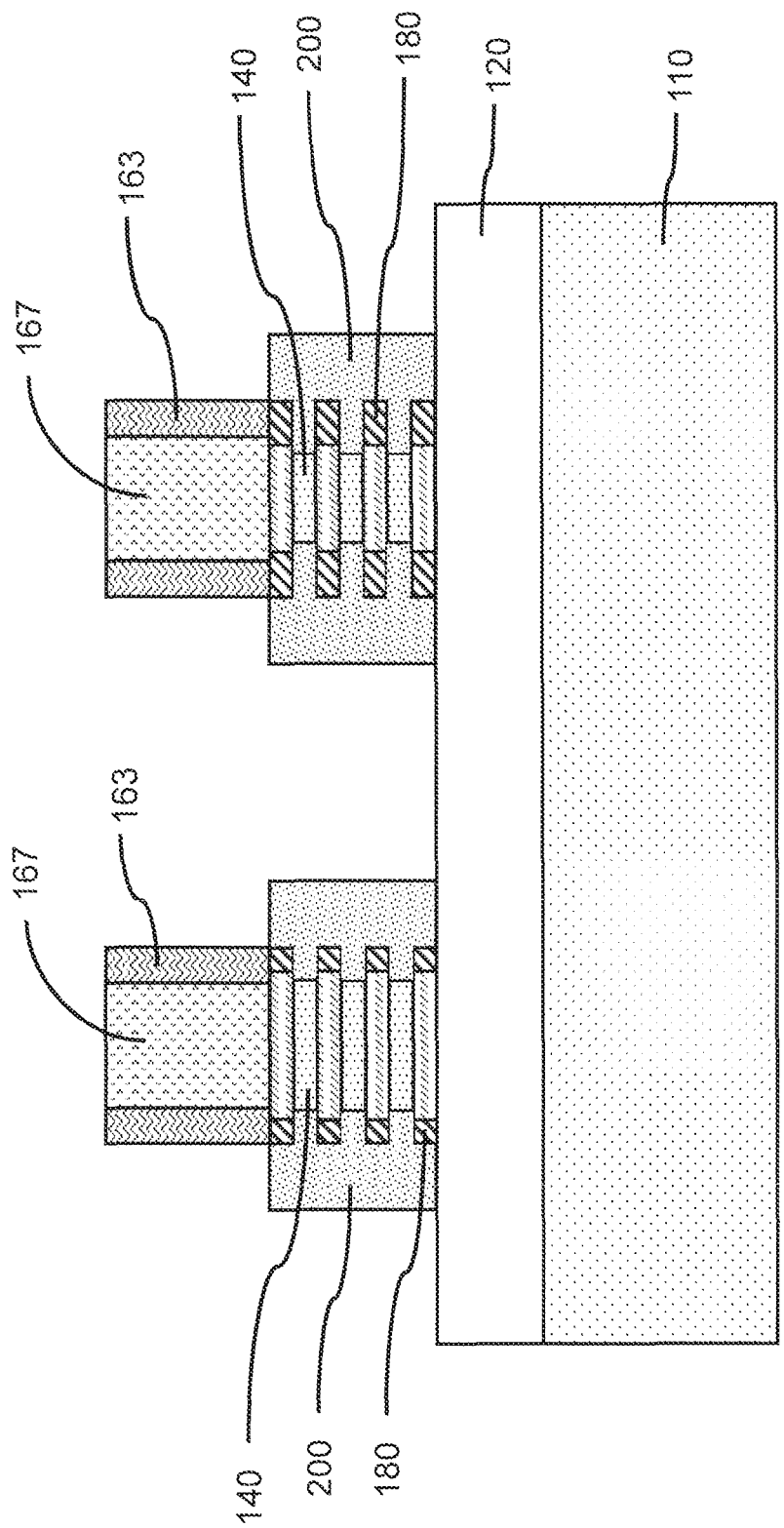
FIG. 13 is a cross-sectional side view of source/drain regions formed on the nano-sheet channel layers on either side of each of the two cut-stacks, in accordance with an embodiment of the present invention.

FIG. 13 is a cross-sectional side view of source/drains formed on the nano-sheet channel layers on either side of each of the two cut-stacks, in accordance with an embodiment of the present invention.

In one or more embodiments, a source/drain (S/D) regions 200 can be formed on the nano-sheet channel layers 140, where the source/drain regions 200 can be formed by an epitaxial growth process on exposed crystalline faces of the nano-sheet channel layers 140. The source/drain regions 200 can be in physical and electrical contact with each of the one or more nano-sheet channel layer(s) 140 in the cut-stack 155.

In various embodiments, the source/drain region(s) 200 can be silicon or silicon-germanium suitably doped to form an n-type or a p-type field effect transistor (nFET or pFET). The S/D region(s) can be doped in situ (i.e. during formation).

Figure 14:
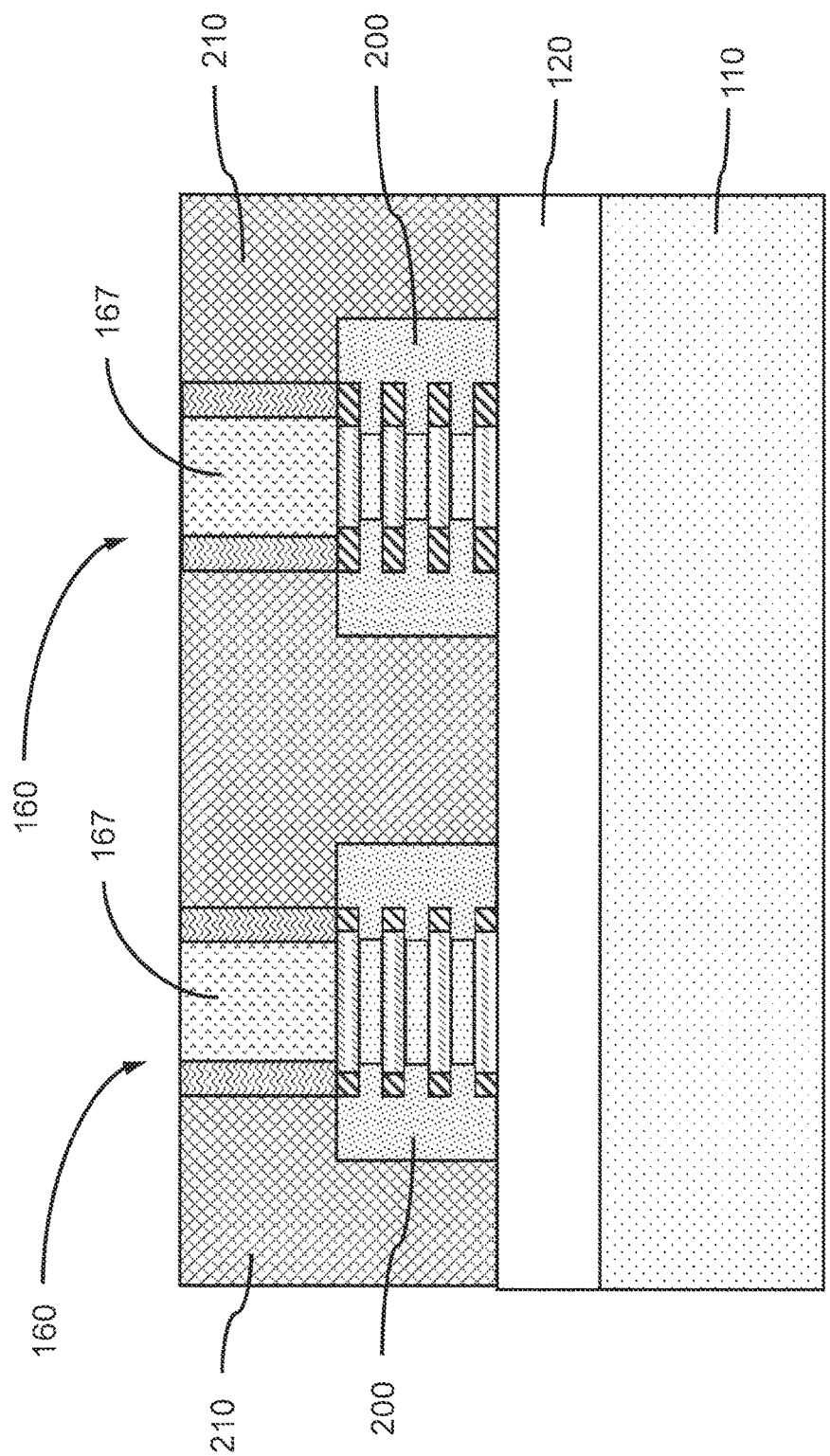
FIG. 14 is a cross-sectional side view of an interlayer dielectric (ILD) formed on the two cut-stacks and dummy gates, in accordance with an embodiment of the present invention.

FIG. 14 is a cross-sectional side view of an interlayer dielectric formed on the two cut-stacks and dummy gates, in accordance with an embodiment of the present invention.

In one or more embodiments, an interlayer dielectric (ILD) 210 can be formed on the source/drain region(s) 200. The interlayer dielectric (ILD) 210 can be formed by a blanket deposition that covers the source/drain region(s) 200, as well as portions of the dummy gate(s) 160, substrate insulator layer 120, and/or substrate surface. The interlayer dielectric (ILD) 210 can extend above the top surface of the dummy gates 160, and chemical-mechanical polishing (CMP) can be utilized to remove the excess material and provide a smooth, flat surface.

In various embodiments, the interlayer dielectric (ILD) 210 can be silicon oxide or a low-k dielectric, where the ILD can be formed by CVD, LPCVD, or spun on. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

Figure 15:
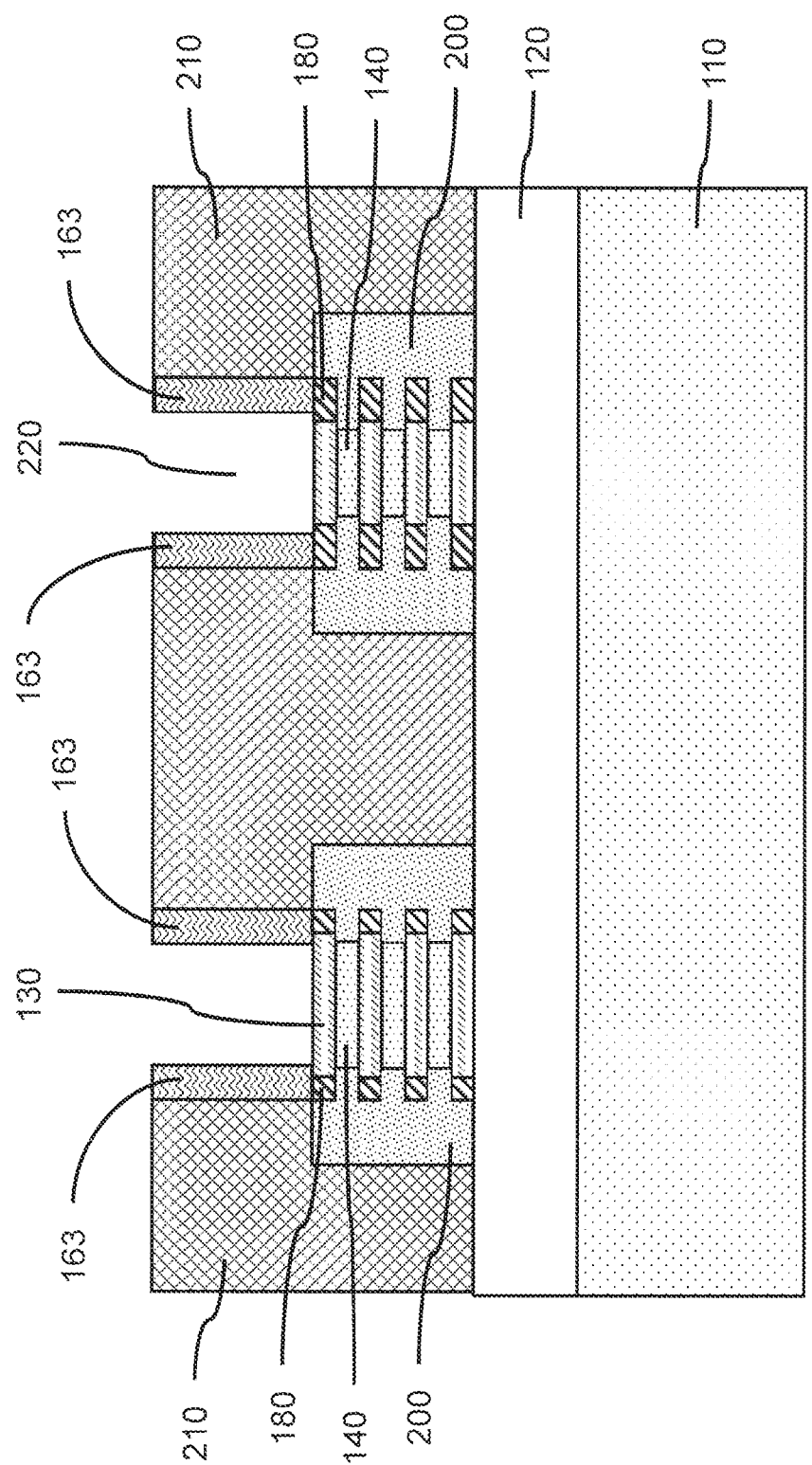
FIG. 15 is a cross-sectional side view of an interlayer dielectric on the two cut-stacks after removal of the dummy gate fill, in accordance with an embodiment of the present invention.

FIG. 15 is a cross-sectional side view of an interlayer dielectric on the two cut-stacks after removal of the dummy gate fills, in accordance with an embodiment of the present invention.

In one or more embodiments, the dummy gate fill 167 of the dummy gate(s) 160 can be removed to expose the underlying cut-stack 155, where the dummy gate fill can be selectively removed. Selective removal of the dummy gate fill 167 can expose at least a portion of the underlying sacrificial release layer(s) 130, and nano-sheet channel layer(s) 140. Removal of the dummy gate fill 167 may also expose at least a portion of the indentation fill layer 180 directly below the side spacer 163. The side spacer 163 can remain around at least a portion of the cut-stack 155 to provide a defined opening 220 for formation of an active gate structure.

In one or more embodiments, the dummy gate fill 167 can be removed by an isotropic etch, for example, a wet etch, that is selective for the material of the dummy gate fill 167 relative to the side spacer 163, sacrificial release layer(s) 130, and nano-sheet channel layers 140.

Figure 16:
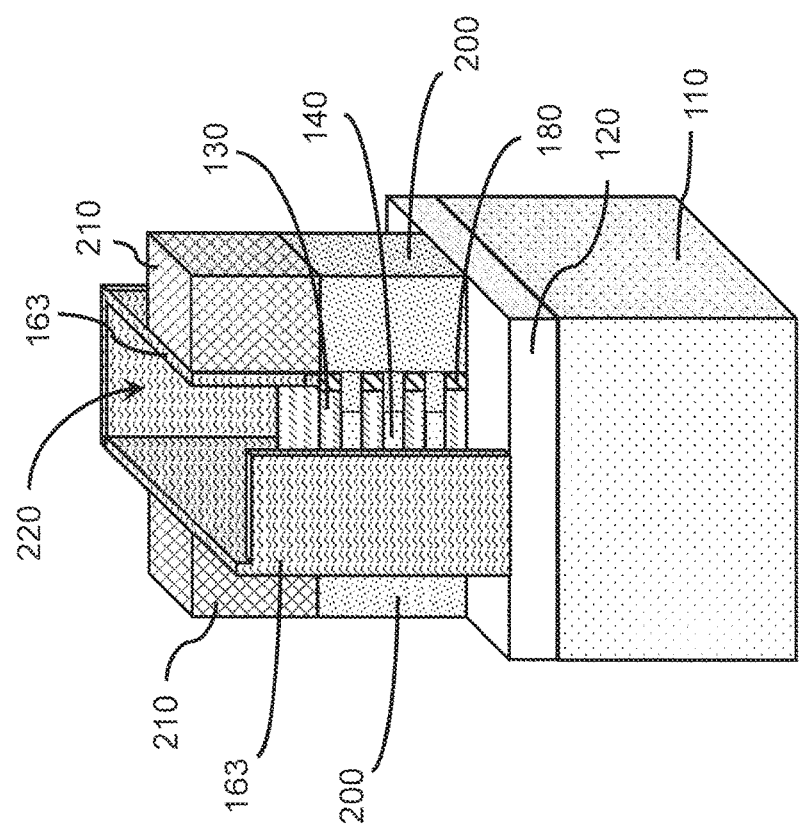
FIG. 16 is a cut-away isometric view of the long axis of the patterned nano-sheet device after removing the dummy gate fill from within the side spacer, in accordance with an embodiment of the present invention.

FIG. 16 is a cut-away isometric view of the long axis of the patterned nano-sheet device after removing the dummy gate fill from within the side spacer, in accordance with an embodiment of the present invention.

As illustrated, the side spacer 163 can remain around at least a portion of the cut-stack 155 to provide a defined opening 220 for formation of an active gate structure, where a portion of the side spacer 163 has been cut away to show the opening formed by removal of the dummy gate fill 167 and the underlying cut-stack 155. Only portions of the ILD 210 on the source/drain regions 200 are shown. The ILD 210 can surround the source/drain regions 200 and side spacer 163. The dummy gate 160 can surround three sides of the patterned channel stack 150, and subsequent cut-stack 155.

Figure 17:
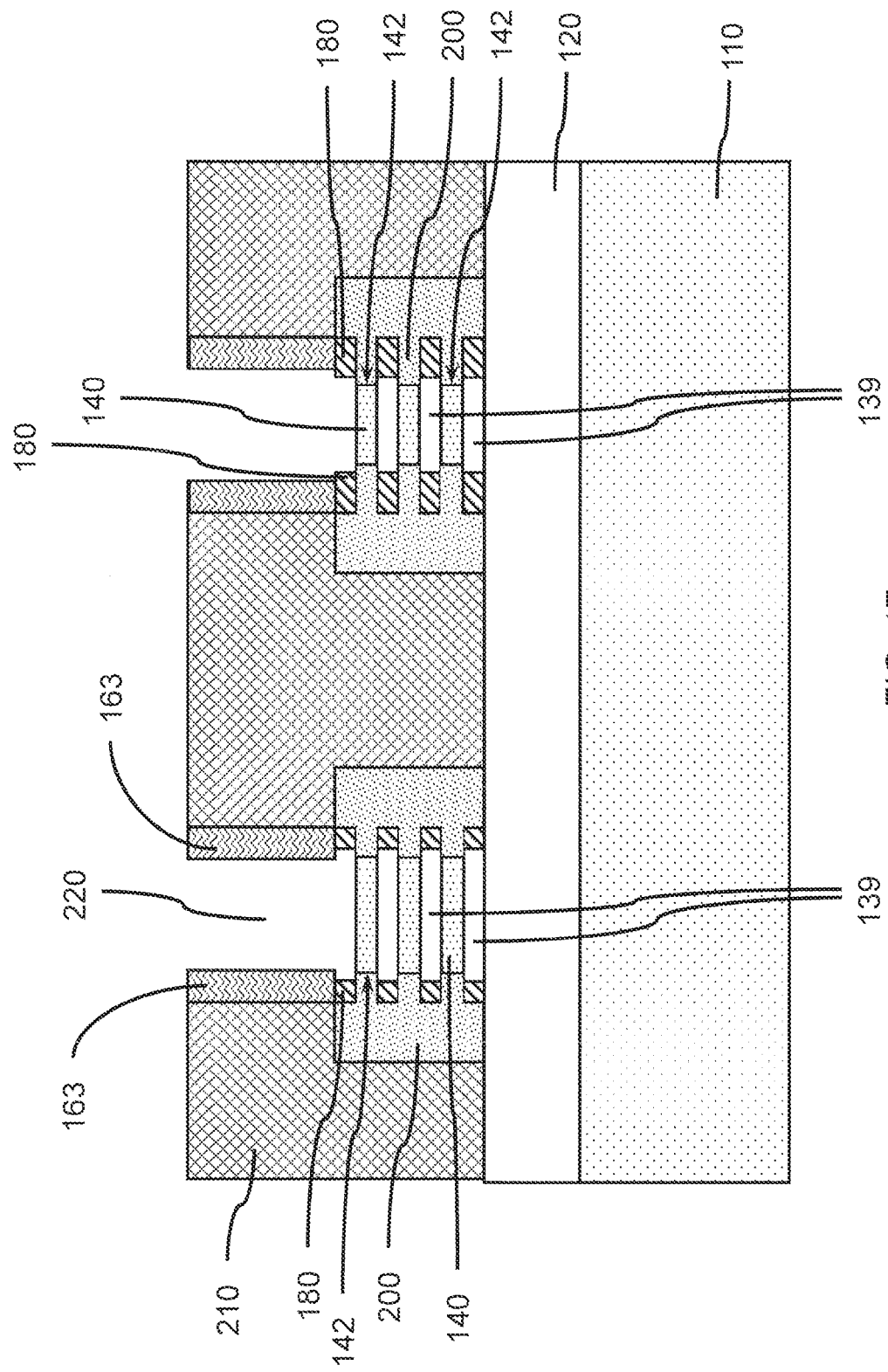
FIG. 17 is a cross-sectional side view of a plurality of freed nano-sheet channel layers after removal of the intervening sacrificial release layers in the two cut-stacks, in accordance with an embodiment of the present invention.

FIG. 17 is a cross-sectional side view of a plurality of freed nano-sheet channel layers after removal of the intervening sacrificial release layers in the two cut-stacks, in accordance with an embodiment of the present invention.

In one or more embodiments, the remaining portions of the sacrificial release layer(s) 130 of the cut-stack(s) 155 can be removed to release the nano-sheet channel layer(s) 140, where the nano-sheet channel layer(s) 140 can be secured at the opposite end faces 142 to the source/drain regions 200 formed in the recess(es) 145. The indentation fill layer 180 can be between the source/drain regions 200 in the recess(es) 145. The nano-sheet channel layer(s) 140 can span the distance between the two source/drain regions 200 on opposites sides of the dummy gate. Removal of the sacrificial release layer(s) 130 can form air gaps 139 between the nano-sheet channel layer(s) 140, where the nano-sheet channel layer(s) 140 can be exposed on the four sides not in direct contact with the source/drain regions 200 at opposite end faces 142.

In one or more embodiments, the sacrificial release layer(s) 130 can be removed using an isotropic etch, for example, a wet etch selective for the material of the sacrificial release layer(s) 130. In various embodiments, the etchant can be introduced into the opening 220, such that the etchant can access the sides of the cut-stack 155 including the sidewalls of the sacrificial release layer(s) 130. In various embodiments, a sacrificial release layer 130 is between the substrate insulator layer 120 and the lower-most nano-sheet channel layer 140, so a subsequently formed gate electrode (i.e., work function layer and gate fill layer) can wrap around the lower-most nano-sheet channel layer 140.

Figure 18:
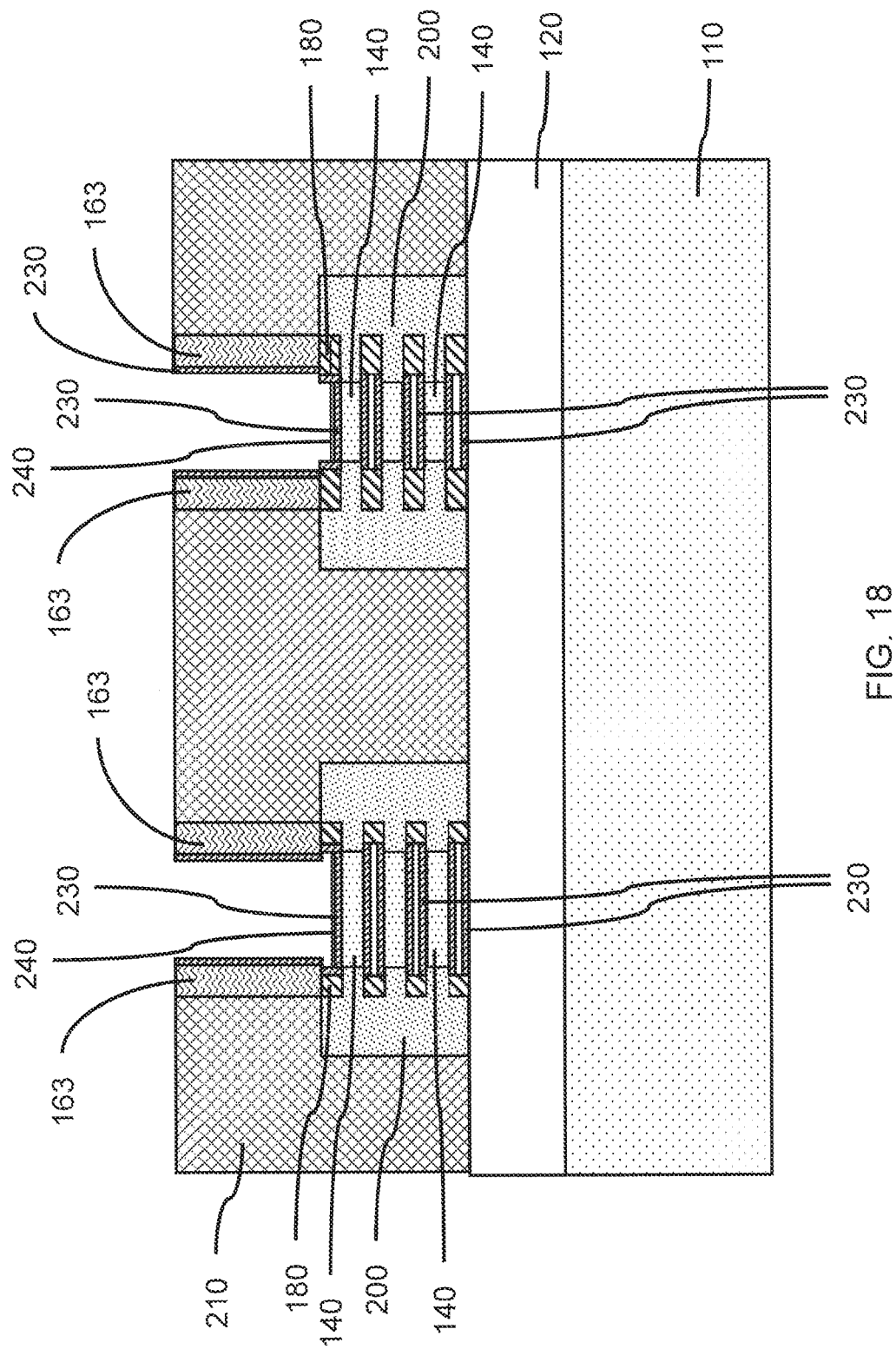
FIG. 18 is a cross-sectional side view of a gate dielectric layer on the exposed surfaces of the nano-sheets and side spacers, in accordance with an embodiment of the present invention.

FIG. 18 is a cross-sectional side view of a gate dielectric layer on the exposed surfaces of the nano-sheets, in accordance with an embodiment of the present invention.

In one or more embodiments, a gate dielectric layer 230 can be formed on the exposed surfaces of the nano-sheet channel layer(s) 140, where the gate dielectric layer 230 can be formed by a conformal deposition process, for example, ALD, CVD, or combinations thereof. In various embodiments, the precursors for the gate dielectric layer 230 can be selected based on the ability of entering the spaces formed between the nanosheet channel layer(s) 140 vacated by the sacrificial release layer(s) 130. In one or more embodiments, the precursors for the gate dielectric layer 230 can be introduced into the opening(s) 220.

In one or more embodiments, the gate dielectric layer 230 can be formed on the exposed surfaces of the substrate insulator layer 120 on opposite sides of the cut-stack 155 at the bottom of the opening 220 within the side spacer 163. The gate dielectric layer 230 can also be formed on the inside surfaces of the side spacer 163.

In one or more embodiments, the gate dielectric layer 230 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 230 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb$(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, a work function layer 240 can be formed on the gate dielectric layer 230, where the work function layer and gate dielectric layer 230 can surround at least a portion of each of the one or more nano-sheet channel layer(s) 140. A work function layer 240 can be formed on the exposed portion(s) of the gate dielectric layer 230 between the nano-sheet channel layer(s) 140. The work function layer 240 can be formed on the gate dielectric layer 230 to adjust the electrical properties of a gate electrode. In various embodiments, the work function layer can be optional. A portion of the work function layer 240 can be formed on the gate dielectric layer 230 on the substrate insulator layer 120 beneath the bottom-most nano-sheet channel layer 140.

In one or more embodiments, the work function layer 240 can fill in the spaces between the gate dielectric layer 230 on the nanosheet channel layer(s) 140. The work function layer can be formed by a conformal deposition, for example, ALD.

In various embodiments, a work function layer 240 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 240 can include multiple layers of work function materials, for example, a work function layer can be a TiN/TiC stack.

In various embodiments, the work function layer 240 can have a thickness in the range of about 3 nm to about 11 nm, or can have a thickness in the range of about 5 nm to about 8 nm.

Figure 19:
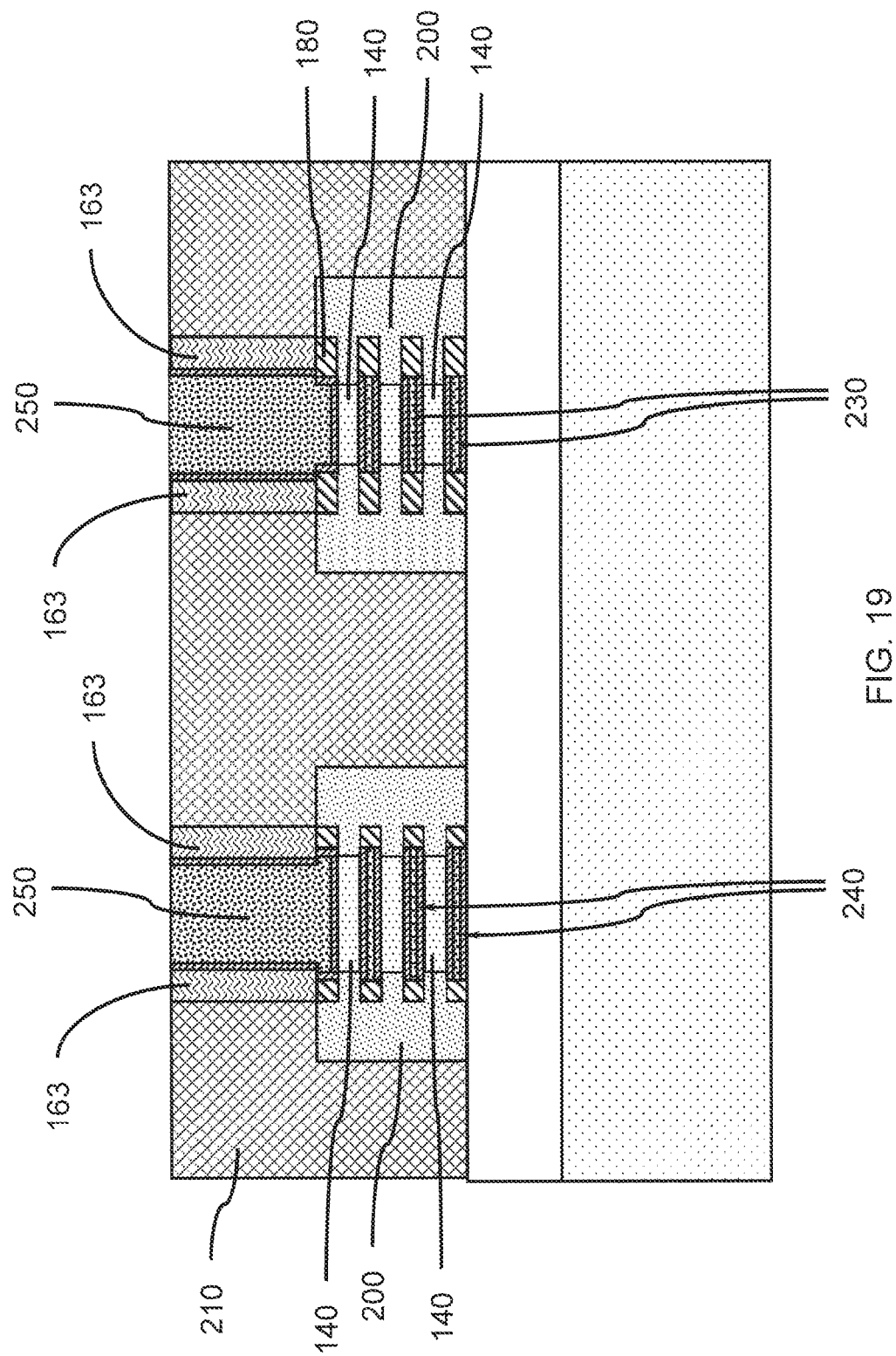
FIG. 19 is a cross-sectional side view of a gate structure on the nano-sheets of each of the cut-stacks, in accordance with an embodiment of the present invention.

FIG. 19 is a cross-sectional side view of a gate structure on each of the cut-stacks, in accordance with an embodiment of the present invention.

In one or more embodiments, a gate fill layer 250 can be formed on the gate dielectric layer 230 and/or work function layer 240 if present, where the gate fill layer 250 can fill in the space of opening 220 in between side spacers 163. The gate fill layer 250, gate dielectric layer 230, and optionally the work function layer 240, can form a gate structure on one or more nano-sheet channel layer(s) 140, where the gate fill layer 250 and work function layer 240 can form a conductive gate electrode.

In various embodiments, the gate fill layer 250 can be blanket deposited on the exposed surfaces of the gate dielectric layer 230 and/or work function layer 240. The formed gate fill layer 250 can extend above the top surface of the interlayer dielectric 210, where the gate fill layer material above the top surfaces of the interlayer dielectric 210 can be removed by a CMP to provide a flat, uniform surface.

In various embodiments, the gate fill layer 250 can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

In one or more embodiments, the gate dielectric layer 230 and the work function layer 240 can wrap around each of the nano-sheet channel layer(s) 140, and the gate fill layer 250 can surround the nano-sheet channel layer(s) 140 and work function layer 240. The gate dielectric layer 230 can extend up the inside surface of the side spacer 163, and the interlayer dielectric (ILD) 210 can be on the outside surface of the sidewall spacer 163.

In various embodiments, the width of the gate fill layer 250 or gate electrode at the top of the gate structure can be the same for both (or all) of the nano-sheet devices, whereas the width of the gate fill layer 250 at the bottom of the gate structure (adjacent to the top-most nano-sheet channel layer 140) can be greater than the width at the top for one or more of the gate structure(s) and less than the width at the top for one or more other gate structure(s). In various embodiments, the overlap between the gate fill layer 250 or gate electrode at the bottom of the gate structure adjacent to the top-most nano-sheet channel layer 140 and the portion of the source/drain regions 200 extending into the recess 145 can be the same, such that the overlap capacitance, $C_{ov}$, of both nano-sheet devices is essentially the same (e.g., within process control tolerances), while the electrical gate lengths, $L_{Ge}$, and threshold voltage, $V_T$, are different for each nano-sheet device. The overlap can be measured between the source/drain region 200 and the bottom area of the gate electrode. The lengths of the indentation fill layer 180 can adjust for the difference in the lengths of the nano-sheet channel layer(s) 140 of two different devices. Nano-sheet transistor devices can thereby be fabricated with the same physical gate length, $L_G$, but with different electrical gate lengths, $L_{Ge}$, and resulting threshold voltages, $V_T$. For a CMOS technology, transistors with different threshold voltages, $V_T$, could achieve optimal tradeoff between performance and power consumption.

In various embodiments, electrical contacts can be formed to the gate structure and source/drain regions 200 for electrically connecting the nano-sheet devices.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A pair of adjacent nano-sheet devices on the same substrate, comprising:
a first nano-sheet device including:
two source/drain regions on a substrate, wherein the two source/drain regions are separated by a first distance;
at least one nano-sheet channel layer having a length spanning the first distance between the two source/drain regions; and
a first gate structure on the at least one nano-sheet channel layer having a first physical gate length; and
a second nano-sheet device including:
two source/drain regions on the substrate, wherein the two source/drain regions are separated by a second distance;
at least one nano-sheet channel layer having a length spanning the second distance between the two source/drain regions; and
a second gate structure on the at least one nano-sheet channel layer having a second physical gate length;
wherein the first physical gate length of the first nano-sheet device is the same as the second physical gate length of the second nano-sheet device, and the length of the at least one nano-sheet channel layer of the second nano-sheet device is less than the second physical gate length and the length of the at least one nano-sheet channel layer of the first nano-sheet device.

2. The pair of adjacent nano-sheet devices of claim 1, wherein the first gate structure and the second gate structure each includes a gate dielectric layer and a work function layer that wraps around each of the at least one nano-sheet channel layer.

3. The pair of adjacent nano-sheet devices of claim 1, wherein the at least one nano-sheet channel layer of the first nano-sheet device is silicon.

4. The pair of adjacent nano-sheet devices of claim 1, further comprising an indentation fill layer on at least a portion of each of the two source/drain regions of the first nano-sheet device.

5. The pair of adjacent nano-sheet devices of claim 4, wherein the indentation fill layer is silicon nitride (SiN), a silicon oxide (SiO), a high-k metal oxide, or suitable combinations thereof.

6. The pair of adjacent nano-sheet devices of claim 4, wherein the first gate structure and the second gate structure each includes a gate fill layer that is a conductive metal, a conductive carbon material, or a suitable combination thereof.

7. The pair of adjacent nano-sheet devices of claim 1, wherein the at least one nano-sheet channel layer of a first nano-sheet device has a length in a range of about 15 nm to about 19 nm, and the at least one nano-sheet channel layer of a second nano-sheet device has a length in a range of about 20 nm to about 25 nm.

8. The pair of adjacent nano-sheet devices of claim 1, wherein the nano-sheet channel layers of first and second nano-sheet devices have a difference in length in a range of about 2 nm to about 10 nm.

9. The pair of adjacent nano-sheet devices of claim 1, wherein the length of the at least one nano-sheet channel layer of the second nano-sheet device is less than the physical gate length of the second nano-sheet device.

10. A pair of adjacent nano-sheet devices on the same substrate, comprising:
a first nano-sheet device including:
a first active gate structure including a first gate fill layer and a side spacer on opposite sides of the first gate fill layer;
an indentation fill layer on each of the opposite sides of the first gate fill layer below the side spacer;
two source/drain regions on a substrate, wherein a portion of each source/drain region extends below one of the indentation fill layers; and
at least one nano-sheet channel layer, wherein the portion of each source/drain region that extends below one of the indentation fill layers is in contact with an end of the at least one nano-sheet channel layer; and
a second nano-sheet device including:
a second active gate structure including a second gate fill layer and a side spacer on opposite sides of the second gate fill layer;
an indentation fill layer on each of the opposite sides of the second gate fill layer below the side spacer;
two source/drain regions on the substrate, wherein a portion of each source/drain region extends below one of the indentation fill layers; and
at least one nano-sheet channel layer, wherein the portion of each source/drain region that extends below one of the indentation fill layers is in contact with an end of the at least one nano-sheet channel layer, wherein the length of the at least one nano-sheet channel layer of the second device is less than the width of the second gate fill layer between the side spacers on opposite sides of the second gate fill layer, and the length of the at least one nano-sheet channel layer of the first device is greater than the width of the first gate fill layer between the side spacers on opposite sides of the first gate fill layer.

11. The pair of adjacent nano-sheet devices of claim 10, wherein the width of the first gate fill layer between the side spacers of the first active gate structure is the same as the width of the second gate fill layer between the side spacers of the second gate structure, and the width of the first gate fill layer between the indentation fill layer of the first active gate structure adjacent to a top-most nano-sheet channel layer is greater than the width between the side spacers of the first active gate structure.

12. The pair of adjacent nano-sheet devices of claim 11, further comprising a first gate dielectric layer on a top-most nano-sheet channel layer of the first nano-sheet device, a portion of each of the indentation fill layers on each of the opposite sides of the first gate fill layer, and the side spacer on opposite sides of the first gate fill layer.

13. The pair of adjacent nano-sheet devices of claim 12, wherein the substrate includes a substrate insulator layer, and the gate dielectric layer is on a surface of the substrate insulator layer below the at least one nano-sheet channel layer of the first nano-sheet device, and the gate dielectric layer is on a surface of the substrate insulator layer below the at least one nano-sheet channel layer of the second nano-sheet device.

14. A pair of adjacent nano-sheet devices on the same substrate, comprising:
   a first nano-sheet device including:
      a first active gate structure including a first gate fill layer and a side spacer on opposite sides of the first gate fill layer;
      an indentation fill layer on each of the opposite sides of the first gate fill layer below the side spacer;
      two source/drain regions on a substrate, wherein a portion of each source/drain region extends below one of the indentation fill layers; and
      at least one nano-sheet channel layer, wherein each of the two source/drain regions is on an opposite side of the at least one nano-sheet channel layer, and the at least one nano-sheet channel layer has a length greater than the distance between the side spacers on opposite sides of the first gate fill layer; and
   a second nano-sheet device including:
      a second active gate structure including a second gate fill layer and a side spacer on opposite sides of the second gate fill layer;
      an indentation fill layer on each of the opposite sides of the second gate fill layer below the side spacer, wherein the distance between the indentation fill layer on each of the opposite sides of the second gate fill layer is less than the distance between the side spacers on opposite sides of the second gate fill layer;
      two source/drain regions on the substrate, wherein a portion of each source/drain region extends below one of the indentation fill layers; and
      at least one nano-sheet channel layer, wherein each of the two source/drain regions is on an opposite side of the at least one nano-sheet channel layer, and the at least one nano-sheet channel layer has a length less than the distance between the indentation fill layer on each of the opposite sides of the second gate fill layer.

15. The pair of adjacent nano-sheet devices of claim 14, wherein the length of the indentation fill layers of the first nano-sheet device is different than the length of the indentation fill layers of the second nano-sheet device.

16. The pair of adjacent nano-sheet devices of claim 14, further comprising a first gate dielectric layer on a top-most nano-sheet channel layer of the first nano-sheet device, a portion of each of the indentation fill layers on each of the opposite sides of the first gate fill layer, and the side spacer on opposite sides of the first gate fill layer.

17. The pair of adjacent nano-sheet devices of claim 16, further comprising a first work function layer on the first gate dielectric layer, wherein the first work function layer is between the first gate fill layer and the first gate dielectric layer.

18. The pair of adjacent nano-sheet devices of claim 17, wherein the substrate includes a substrate insulator layer, and the first gate dielectric layer is on a surface of the substrate insulator layer below the at least one nano-sheet channel layer of the first nano-sheet device, and the gate dielectric layer is on a surface of the substrate insulator layer below the at least one nano-sheet channel layer of the second nano-sheet device.

19. The pair of adjacent nano-sheet devices of claim 18, wherein the first gate dielectric layer is a high-K dielectric material.

* * * * *